US011862524B2

(12) United States Patent
Steely-Tarshish et al.

(10) Patent No.: US 11,862,524 B2
(45) Date of Patent: Jan. 2, 2024

(54) OVERLAY MARK DESIGN FOR ELECTRON BEAM OVERLAY

(71) Applicant: KLA Corporation, Milpitas, CA (US)

(72) Inventors: Inna Steely-Tarshish, Yokneam Ilit (IL); Stefan Eyring, Weilburg (DE); Mark Ghinovker, Yoqneam Ilit (IL); Yoel Feler, Haifa (IL); Eitan Hajaj, Ashqelon (IL); Ulrich Pohlmann, Jena (DE); Nadav Gutman, Zichron Ya'aqov (IL); Chris Steely, Yokneam Ilit (IL); Raviv Yohanan, Qiryat Motzkin (IL); Ira Naot, Milpitas, CA (US)

(*) Notice: Subject to any disclaimer, the term of this patent is extended or adjusted under 35 U.S.C. 154(b) by 191 days.

(21) Appl. No.: 17/487,842

(22) Filed: Sep. 28, 2021

(65) Prior Publication Data
US 2022/0415725 A1    Dec. 29, 2022

Related U.S. Application Data

(60) Provisional application No. 63/215,561, filed on Jun. 28, 2021.

(51) Int. Cl.
*H01L 21/66* (2006.01)
*H01L 23/544* (2006.01)

(52) U.S. Cl.
CPC ............ *H01L 22/30* (2013.01); *H01L 23/544* (2013.01); *H01L 22/12* (2013.01)

(58) Field of Classification Search
None
See application file for complete search history.

(56) References Cited

U.S. PATENT DOCUMENTS

| | | |
|---|---|---|
| 6,985,618 B2 | 1/2006 | Adel et al. |
| 7,193,699 B2 | 3/2007 | Michelsson |
| 7,292,328 B2 | 11/2007 | Kreh et al. |
| 7,417,719 B2 | 8/2008 | Michelsson |
| 7,477,370 B2 | 1/2009 | Michelsson et al. |
| 7,657,077 B2 | 2/2010 | Michelsson et al. |
| 7,973,931 B2 | 7/2011 | Michelsson et al. |
| 8,200,003 B2 | 6/2012 | Michelsson |
| 8,200,004 B2 | 6/2012 | Michelsson et al. |
| 8,264,534 B2 | 9/2012 | Michelsson |

(Continued)

FOREIGN PATENT DOCUMENTS

DE    102005014595 A1    10/2006

OTHER PUBLICATIONS

WIPO, International Search Report for International Application No. PCT/US2022/033903, dated Oct. 19, 2022.

(Continued)

*Primary Examiner* — Alexander G Ghyka
(74) *Attorney, Agent, or Firm* — Hodgson Russ LLP

(57) ABSTRACT

The present disclosure provides a target and a method of performing overlay measurements on a target. The target includes an array of cells comprising a first cell, a second cell, a third cell, and a fourth cell. Each cell includes a periodic structure with a pitch. The periodic structure includes a first section and a second section, separated by a first gap. The target further includes an electron beam overlay target, such that electron beam overlay measurements, advanced imaging metrology, and/or scatterometry measurements can be performed on the target.

20 Claims, 19 Drawing Sheets

(56) References Cited

U.S. PATENT DOCUMENTS

| | | |
|---|---|---|
| 8,705,837 B2 | 4/2014 | Michelsson et al. |
| 10,002,806 B2 | 6/2018 | Amir et al. |
| 10,473,460 B2 | 11/2019 | Gutman et al. |
| 10,474,040 B2 | 11/2019 | Laske et al. |
| 11,112,369 B2 | 9/2021 | Gready |
| 11,182,892 B2 | 11/2021 | Michelsson et al. |
| 2004/0165764 A1 | 8/2004 | Michelsson |
| 2005/0008217 A1 | 1/2005 | Luu et al. |
| 2006/0103838 A1 | 5/2006 | Richter et al. |
| 2006/0240580 A1 | 10/2006 | Michelsson |
| 2008/0062415 A1 | 3/2008 | Michelsson |
| 2008/0249728 A1 | 10/2008 | Michelsson et al. |
| 2013/0242305 A1* | 9/2013 | Cohen .................. H01L 23/544 356/400 |
| 2014/0065736 A1 | 3/2014 | Amir et al. |
| 2014/0375984 A1 | 12/2014 | Choi et al. |
| 2016/0179017 A1* | 6/2016 | Yohanan ............. G03F 7/70625 359/566 |
| 2018/0232478 A1 | 8/2018 | Golovanevsky |
| 2018/0275530 A1 | 9/2018 | Kandel et al. |
| 2018/0364179 A1 | 12/2018 | Gready |
| 2019/0271542 A1 | 9/2019 | Shchegrov et al. |
| 2021/0240089 A1 | 8/2021 | Golotsvan et al. |

OTHER PUBLICATIONS

WIPO, Written Opinion of the International Searching Authority for International Application No. PCT/US2022/03390, dated Oct. 19, 2022.

* cited by examiner

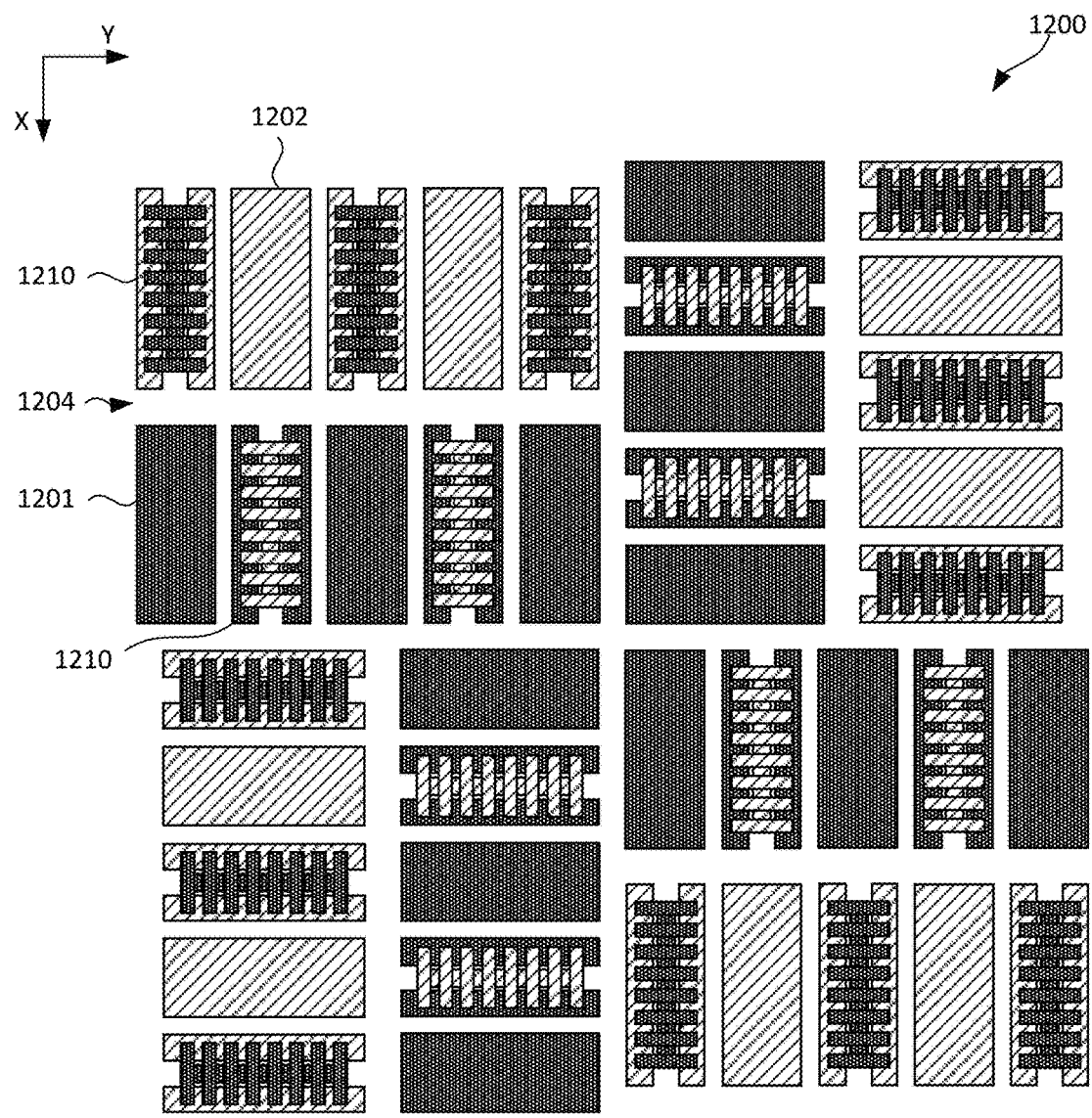
FIG. 12A
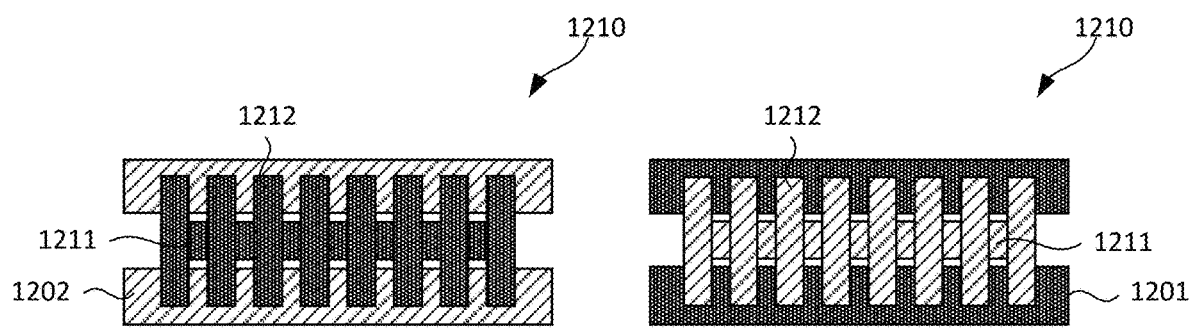
FIG. 12B      FIG. 12C

OVERLAY MARK DESIGN FOR ELECTRON BEAM OVERLAY

CROSS REFERENCE TO RELATED APPLICATIONS

This disclosure is based on, and claims priority to, U.S. Provisional Application No. 63/215,561, filed on Jun. 28, 2021, the entire disclosure of which is incorporated by reference herein.

FIELD OF THE DISCLOSURE

This disclosure relates to overlay measurements in semiconductor devices.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Current methods for optical overlay measurement rely on two main technologies: imaging and scatterometry. In imaging, the position of periodic targets is measured in the field of view of the optical system and the overlay (OVL) is deduced from positions of targets printed in different layers. Scatterometry utilizes interference between electromagnetic (EM) waves scattered by periodic overlay marks (targets with periodic structures) printed at different layers to deduce the relative displacement of the layers. In both cases a control on amplitudes and phases of the diffraction orders of the scattered electromagnetic waves may provide a crucial effect on accuracy and precision of overlay measurement.

When overlay errors are observed, an overlay measurement may be used to apply corrections and to keep overlay errors within desired limits. For example, overlay measurements may be fed into an analysis routine that calculates scanner corrections, as well as other statistics, which may be used by an operator in order to better align the lithography tool used in the process. In typical fabrication operations, semiconductor manufacturing processes are run in batches called lots. A lot, or a wafer lot, is defined as a quantity of wafers which are processed together as a single group. Conventional overlay monitor and control techniques generally take a single set of scanner corrections and apply the same set for all wafers in the same lot.

However, improved target designs and methods of measurement are needed as semiconductor devices become more complex.

BRIEF SUMMARY OF THE DISCLOSURE

Embodiments of the present disclosure provide a target. The target may comprise an array of cells comprising a first cell, a second cell, a third cell, and a fourth cell. Each cell may comprise a periodic structure with a pitch. The periodic structure may include a first section and a second section, separated by a first gap.

According to an embodiment of the present disclosure, the target may further comprise an electron beam overlay target disposed in a center of the array of cells comprising the first cell, the second cell, the third cell, and the fourth cell.

According to an embodiment of the present disclosure, the first cell, the second cell, the third cell, and the fourth cell may be arranged having rotational symmetry.

According to an embodiment of the present disclosure, the periodic structure of each cell may further include a third section separated by a second gap.

According to an embodiment of the present disclosure, the periodic structure of the first cell may have a first cell height along the first axis and a first cell width along the second axis. The periodic structure of the second cell may have a second cell height along the second axis and a second cell width along the first axis. The periodic structure of the third cell may have a third cell height along the second axis and a third cell width along the first axis. The periodic structure of the fourth cell may have a fourth cell height along the first axis and a fourth cell width along the second axis.

According to an embodiment of the present disclosure, the first cell width may be greater than the second cell height, the second cell width may be greater than the third cell height, the third cell width may be greater than the fourth cell height, and the fourth cell width may be greater than the first cell height.

According to an embodiment of the present disclosure, the first cell width may be equal to the second cell height, the second cell width may be equal to the third cell height, the third cell width may be equal to the fourth cell height, and the fourth cell width may be equal to the first cell height.

According to an embodiment of the present disclosure, part of the electron beam overlay target may be a plurality of nested polygonal shapes disposed inside each other that define a center hollow area. The interconnected polygonal shapes may be squares.

According to an embodiment of the present disclosure, the periodic structure of each cell may have a first height and a second height larger than the first height, and the periodic structure with the second height may be disposed adjacent the electron overlay target.

According to an embodiment of the present disclosure, the second section of the periodic structure of each cell may have a second height and a third height less than the second height, and the periodic structure with the third height may be disposed adjacent the electron overlay target.

According to an embodiment of the present disclosure, the target may further comprise a plurality of electron beam overlay targets disposed at an edge of the first cell, the second cell, the third cell, and the fourth cell. Each of the electron beam overlay targets may include a body a plurality of segments extending from the body, and a connecting segment which connects ends of the plurality of segments.

According to an embodiment of the present disclosure, the plurality of the electron beam overlay targets may be disposed at the edge of the first cell, the second cell, the third cell, and the fourth cell adjacent to the first section of the periodic structure.

According to an embodiment of the present disclosure, the plurality of the electron beam overlay targets may be disposed at the edge of the first cell, the second cell, the third cell, and the fourth cell adjacent to the second section of the periodic structure.

According to an embodiment of the present disclosure, the plurality of the electron beam overlay targets may be disposed at the edge of the first cell, the second cell, the third cell, and the fourth cell adjacent to the first gap.

According to an embodiment of the present disclosure, the periodic structures may further include a second pitch between groups of a plurality of periodic structures at the pitch. The second pitch may be larger than the first pitch.

According to an embodiment of the present disclosure, the target may further comprise a plurality of electron beam overlay targets. Each of the electron beam overlay targets may include a plurality of segments extending from two sides of a body. The body may be disposed between pairs of gratings in the first section and the second section of the periodic structure and the plurality of segments may be disposed on the pairs of gratings in the first and second section adjacent to the body.

According to an embodiment of the present disclosure, the plurality of electron beam overlay targets may be disposed between pairs of gratings at ends of the first section and the second section of the periodic structure of each cell.

According to an embodiment of the present disclosure, the plurality of electron beam overlay targets may be disposed between each pair of gratings of the first section and the second section of the periodic structure of each cell.

Another embodiment of the present disclosure provides a method of performing overlay measurements on a target using a semiconductor metrology tool.

DESCRIPTION OF THE DRAWINGS

For a fuller understanding of the nature and objects of the disclosure, reference should be made to the following detailed description taken in conjunction with the accompanying drawings, in which:

FIG. 12A is another combined AIM and eOVL target design according to an embodiment of the present disclosure;

FIGS. 12B and 12C show the eOVL targets of the embodiment of FIG. 12A;

DETAILED DESCRIPTION OF THE DISCLOSURE

Figure 1:
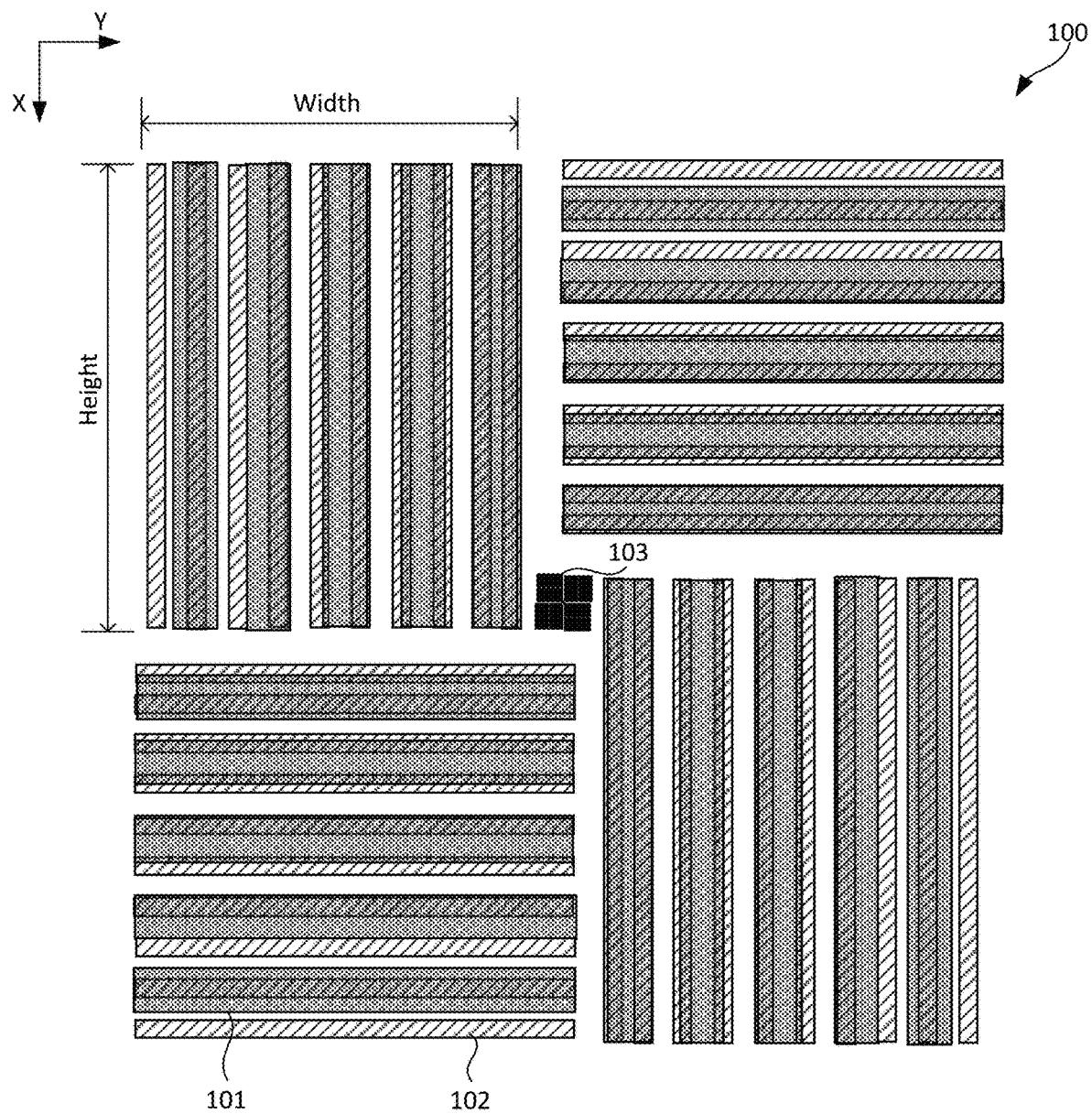
FIG. 1 is four cell scatterometry overlay (SCOL) target with combined placement on an electron beam overlay (eOVL) target in center and edge according to an embodiment of the present disclosure.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

In general, an overlay error between two process layers or a shift between two sets of structures on the same layer may be determined using overlay targets, for which the target structures are designed with a known relationship between their symmetry characteristics and discrepancies from such symmetry correspond to overlay error in such targets. As used herein, a layer may refer to any suitable materials, such as a semiconductor or a photoresist layer that are generated and patterned for fabrication of a wafer device or test structure. Although the following target examples are shown to have structures on two (or more) layers for measuring overlay, each target may include two (or more) sets of structures on the same layer for determining a shift error between such set of structures. Additionally, embodiments of the present disclosure may be applied to any type of periodic targets, and such targets may be formed in an inactive area (e.g., scribe line) or in an active region of a die on of a production wafer (e.g., as part of a device portion of a die). Techniques that are described herein may also be applied to targets for determining other types of characteristics, such as critical dimension (CD), CD uniformity (CDU), edge placement error (EPE), pattern fidelity, etc.

Overlay targets typically occupy an expensive location on an integrated circuit. Semiconductor manufacturers generally seek to decrease measurement time and wafer area of these overlay targets. Space on a wafer can be saved, measurement time can be made faster, and a comparison of results from the two technologies can be performed by combining imaging-based and scatterometry-based targets. Thus, including two targets in an area of an integrated circuit and measuring both overlay targets at the same time would provide benefits to the semiconductor manufacturing process.

Embodiments disclosed herein combine electron beam overlay (eOVL) with scatterometry overlay (SCOL). Currently the scanning electron microscope (SEM) technology is used as a ruler for optical metrology measurements. Embodiments disclosed herein provide solutions with new target designs for electron beam overlay for combination with optical measurements. Target architypes also can combine optical image-based overlay (IBO) and diffraction-based overlay (DBO) targets with electron beam overlay specialized targets. Alternating the combined targets can enable denser sampling to increase model accuracy because the number of measurement samples on the wafer increases while keeping the wafer real estate identical. The mixed targets use 100% real estate available for overlay metrology, which provides a 2× increased number of targets for both technologies.

Target designs disclosed herein can reduce measurement move-acquire-measurement (MAM) time and improve measurements accuracy because the regions of interest (ROI) can contain both X and Y information content within small field of view (FOV). For example, in one ROI, one grating may be for information in the X direction, and another grating may be for information in the Y direction. It may not be necessary to move to two different targets because all the information is contained in one target. Thus, the disclosed targets increase the information content per area.

The measurements can be applied on coarse and fine pitch of the different target architypes. The target stack materials can vary between line and space features. The reverse combination use case can use the current optical targets with a denser sampling of electron beam overlay targets. A combined design of four cell scatterometry overlay and electron beam overlay also can be used.

The embodiments disclosed herein can enable scatterometry target axis separation, which contains two cells per direction as in standard four cell design with prolonged bars in both directions of each layer per cell. This can provide physical separation between the different alignment scheme layers. The region of interest placement on such target type can be separated for each layer. Since multiple region of interest used per direction targets architecture of bar over bar and bar over trench with induced overlay. This can be used for scatterometry target (f0) measurable regardless of their shift coverage. Both directions can be applicable within the same target as well with prolonged bars per axis.

Any design image-based overlay or diffraction-based overlay can enable an electron beam overlay target, center of electron beam overlay, and optical target that coincide. This can eliminate process variation effect, placement error effect, and can improve the ability to correct of the modeled terms. Due to design rules, the electron beam overlay target may be placed as close as possible to the optical target.

Additional segments can be added to the optical target to fill in the space occupied by electron beam overlay target placement or prolongation of the bars, which can enable more information content.

FIG. 1 is a four cell scatterometry overlay (SCOL) target with combined placement on electron beam overlay (eOVL) target in center and edge. For example, scatterometry uses the areas where layers of gratings overlap, while electron beam overlay uses the areas where layers of gratings are separated. The target 100 includes a first periodic structure 101 and a second periodic structure 102. These are shown with different shading for ease of illustration. The first periodic structure 101 is formed on a first layer of a semiconductor device and has a first pitch along an axis and the second periodic structure 102 is formed on a second layer of the semiconductor device and has a second pitch along that axis, different from the first pitch. When suitably illuminated, the first and second periodic structures 101, 102 together form a pattern. The layers can be adjacent to each other or can be separated by other layers. The first periodic structure 101 and second periodic structure 102 are illustrated as see-through for ease of illustration.

Each of a plurality of gratings in the first periodic structure 101 has a first width along a second axis (e.g., X) and a first height along a first axis (e.g., Y). The first width may be between 1 μm and 100 μm. The first height may be between 10 μm and 100 μm. The first width and the first height may be larger or smaller than these ranges depending on the application. The first periodic structure 101 has a first pitch. The first pitch may be between 200 nm and 1000 nm. The first pitch may be larger or smaller than this range depending on the application.

A second periodic structure 102 is formed on a second layer of the semiconductor device. Each of a plurality of gratings in the second periodic structure 102 has a second width along the second axis (e.g., X) and a second height along the first axis (e.g., Y). The second width of the second periodic structure 102 is narrower than the first width of the first periodic structure 101. The second width may be between 1 μm and 100 μm. The second height may be between 10 μm and 100 μm. The second width and the second height may be larger or smaller than these ranges depending on the application. The second periodic structure 102 has a second pitch less than the first pitch of the first periodic structure 101. The second pitch may be between 200 nm and 1000 nm. The second pitch may be larger or smaller than this range depending on the application. The second pitch may be larger than the first pitch. The gratings of the first periodic structure 101 are positioned over the gratings of the second periodic structure 102.

The first and second periodic structures 101, 102 are mutually overlaid and are formed of arrays of mutually parallel lines on the first and second layers of the semiconductor device. The lines are arranged in registration along an axis, such as the Y-axis. The structure sizes, dimensions, and angles of the fine segmentation may depend on the semiconductor manufacturer, technology node, and processing step. Nodes may operate at structure sizes of a few nm to several μm. In the case of diagonal structures, 15° to 30° may be common, but other angles are possible.

Target 100 may be 10 μm to 60 μm in side length. For example, the side lengths of the target 100 may be not greater than 40 μm. In general, the size of the target 100 may depend on the selected optical wavelength and beam size. Larger targets 100 may make measurements easier, but may also take up more area on the semiconductor wafer. Reducing the size of the target 100 may reduce cost of production and increase available space on the wafer. The particular balance of physics and costs to select a target size may depend on the design rules of the process of the specific layer and/or product. The target 100 can be rectangular in shape.

The target 100 further includes an eOVL structure 103. The eOVL structure 103 may be disposed in a center of the target 100. The eOVL structure 103 may be polygonal. For example, the eOVL structure may be rectangular.

Figure 2:
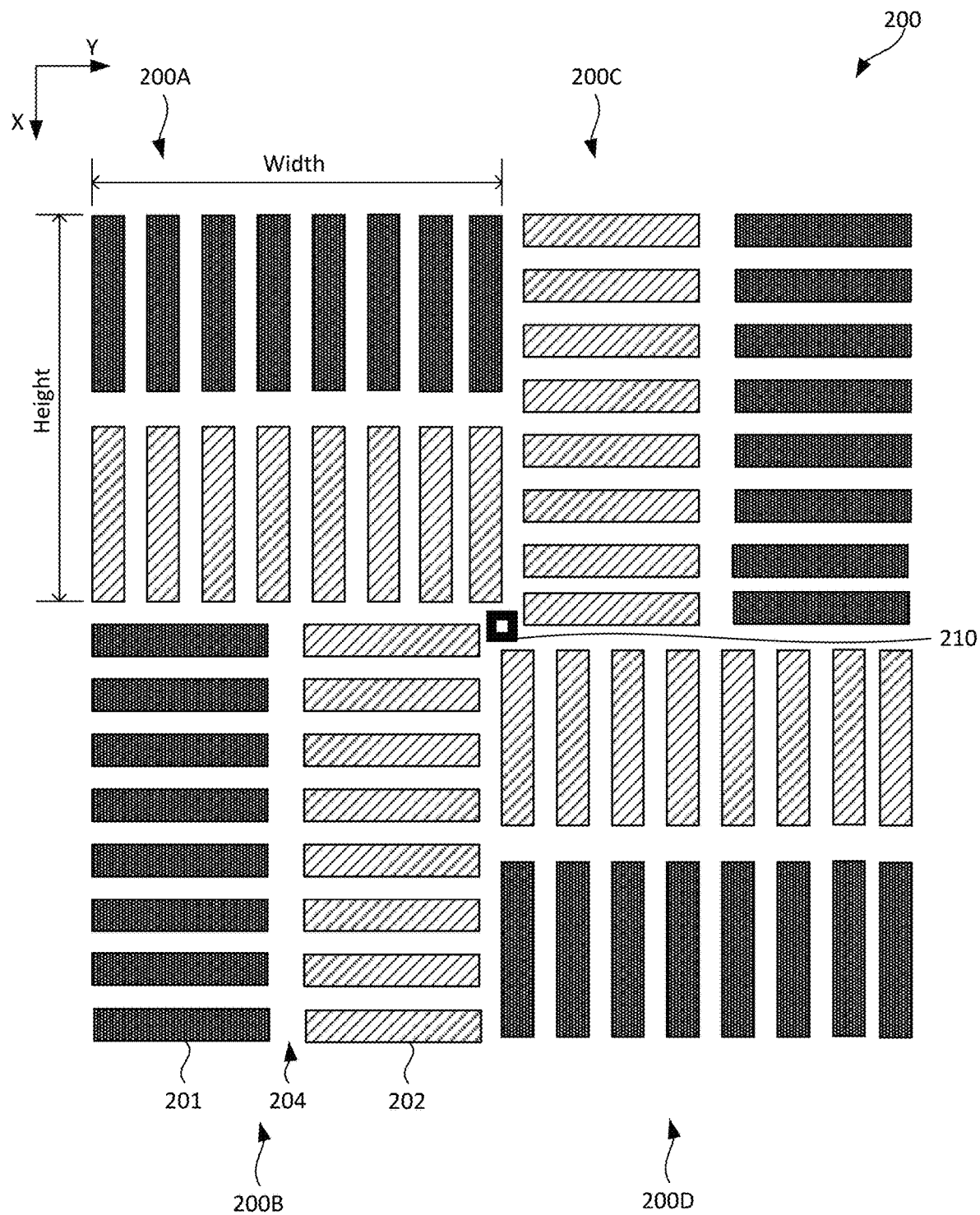
FIG. 2 is an advanced imaging metrology (AIM) target with combined center placement on an eOVL target according to an embodiment of the present disclosure.

FIG. 2 is an advanced imaging metrology (AIM) target with combined center placement on eOVL target. The target 200 may comprise an array of cells. Each cell may include a periodic structure with a pitch. For example, the periodic structure may comprise a plurality of rectangular gratings, where the pitch refers to the distance between adjacent gratings. The periodic structure may include a first section 201 and a second section 202, which are separated by a first gap 204. Target 200 differs from target 100 in that the periodic structures of the first section 201 and the second section 202 are separated, while the first periodic structure 101 and the second periodic structure 102 overlap. In general, the size of the periodic structures of the target 200 may be similar to those of the target 100 described above.

The array of cells may comprise a first cell 200A, a second cell 200B, a third cell 200C, and a fourth cell 200D. The second cell 200B may be arranged along a first axis X and rotated 90 degrees relative to the first cell 200A. The third cell 200C may be arranged along a second axis Y and rotated −90 degrees relative to the first cell 200A. The fourth cell 200D may be arranged along the first axis X relative to the third cell 200C, arranged along the second axis Y relative to the second cell 200B, and rotated 180 degrees relative to the first cell 200A. Accordingly, the array of cells may be arranged in a 2×2 grid, having rotational symmetry. Other arrangements of cells are possible, including 3×3, 4×4, or larger grids.

The target 200 may further comprise an electron beam overlay target 210 disposed in a center of the array of the first cell 200A, the second cell 200B, the third cell 200C, and the fourth cell 200D. The electron beam overlay target 210 may be disposed in other locations of the target 200 depending on the application. The electron beam overlay target 210 may be about 2 μm in size, but smaller or larger sizes are possible.

The periodic structure of the first cell 200A may have a first cell height along the first axis X and a first cell width along the second axis Y. The periodic structure of the second cell 200B may have a second cell height along the second axis Y and a second cell width along the first axis X. The periodic structure of the third cell 200C may have a third cell height along the second axis Y and a third cell width along the first axis X. The periodic structure of the fourth cell 200D may have a fourth cell height along the first axis X and a fourth cell width along the second axis Y.

Target 200 may be 20 μm by 20 μm in size, and may contain a total of 80 lines (20 lines per layer and direction and two layers). The individual lines may be 1 μm in size and 2.5 μm apart. Other sizes of the target 200 and the individual lines and spacings are possible.

Figure 3:
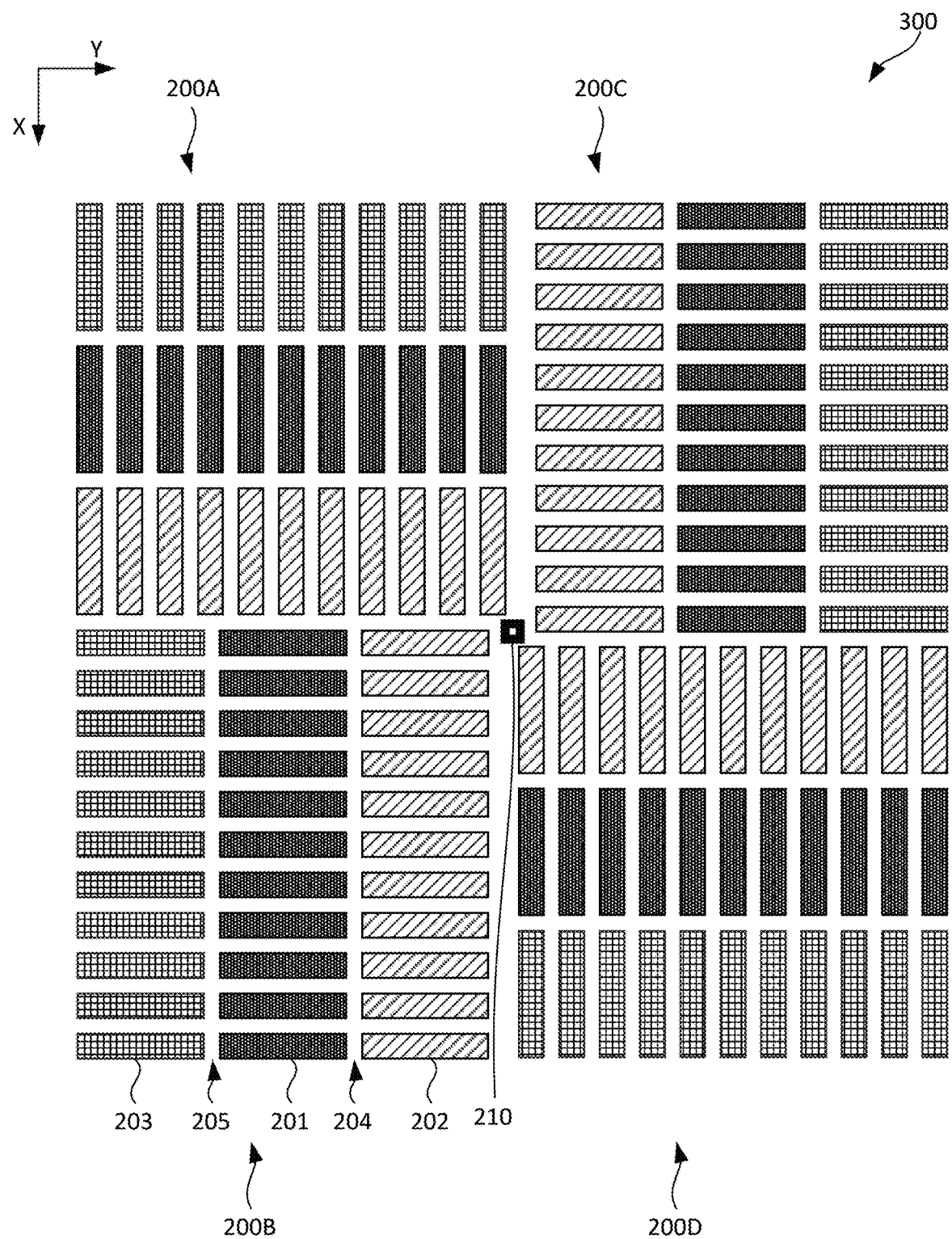
FIG. 3 is a triple AIM target with combined center placement on a triple eOVL target according to an embodiment of the present disclosure.

FIG. 3 is a triple AIM target with combined center placement on triple eOVL target. The target 300 differs from the target 200 in that the periodic structure of each cell may further include a third section 203. The second section 202 and the third section 203 may be separated by a second gap 205. The target 300 may be larger than target 200 to accommodate placement of the third section 203, but the target 300 and its structures may be similar in size to those of the target 200 described above.

Figure 4:
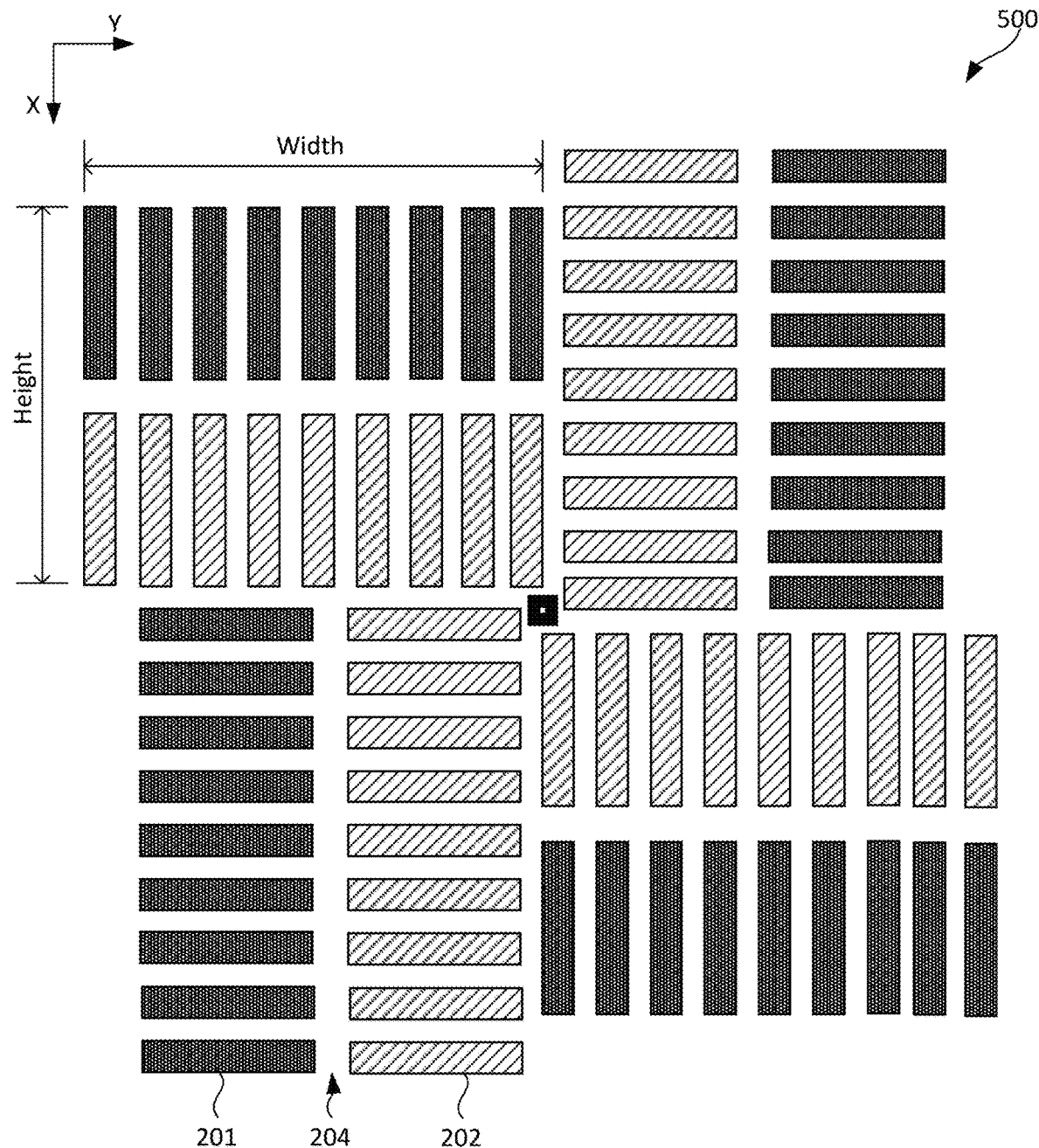
FIG. 4 is an AIM target with combined placement on an eOVL target with added segments in center and edge according to an embodiment of the present disclosure.

FIG. 4 is an AIM target with combined placement on eOVL target with added segments in center and edge. The target 400 differs from the target 200 in that the periodic structure of each cell may include additional gratings. The first section 201 and the second section 202 of each cell may each include additional gratings added at the edge of the target 400 and/or at the center of the target 400. The presence of additional gratings in the target 400 may improve measurement performance as the signal strength increases. The size of the target 400 and its structures may be similar in size to those of target 200 described above.

According to an embodiment of the present disclosure, the first cell width may be greater than the second cell height. The second cell width may be greater than the third cell height. The third cell width may be greater than the fourth cell height. The fourth cell width may be greater than the first cell height. For example, as shown in FIG. 4, each cell in the array of the target 400 may be rectangular. In this arrangement, measurement performance may be improved without sacrificing real estate on the wafer.

Figure 5:
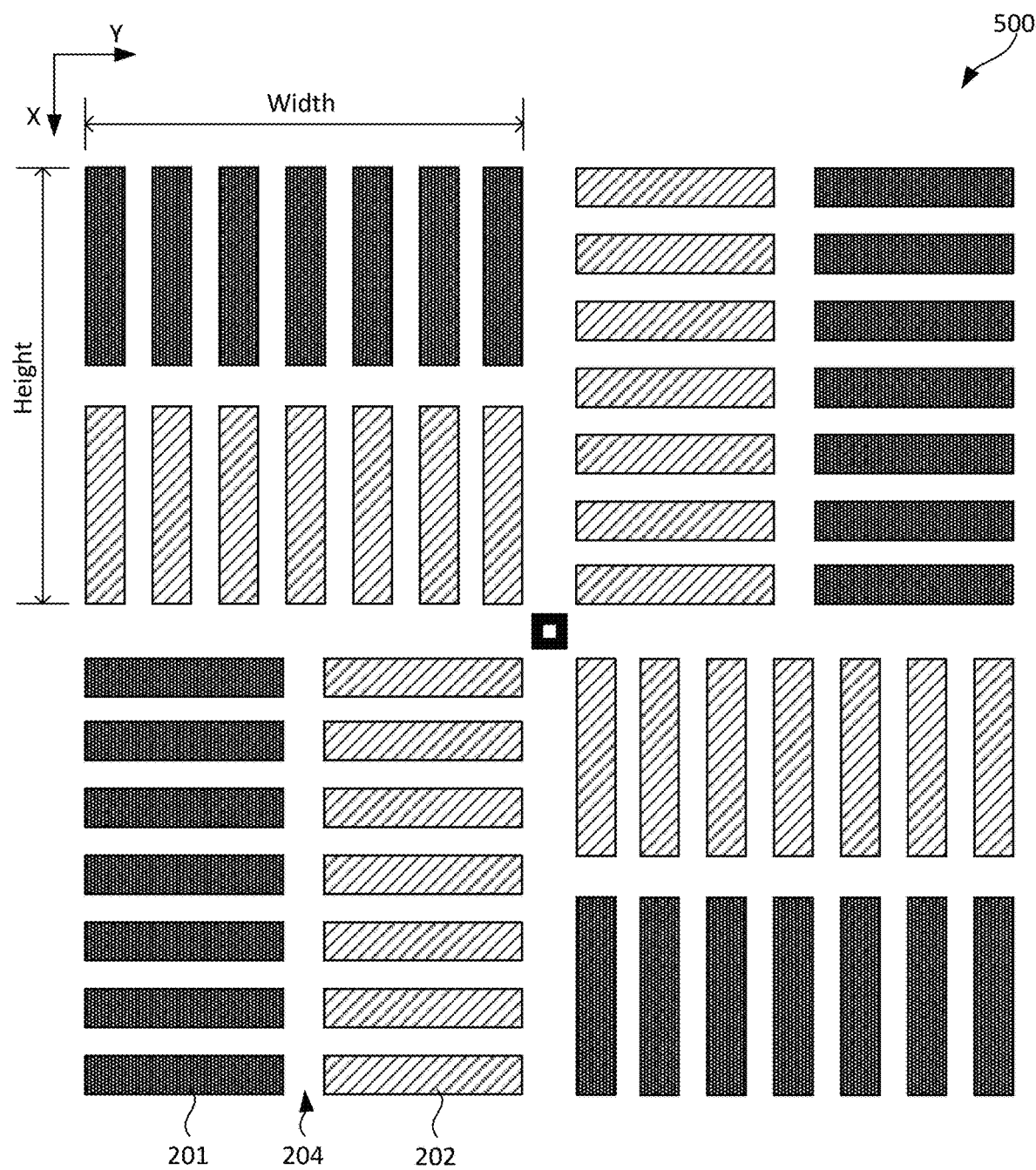
FIG. 5 is an AIM target with combined placement on an eOVL target with no added segments in center and edge according to an embodiment of the present disclosure.

FIG. 5 is an AIM target with combined placement on eOVL target with no added segments in center and edge. The target 500 differs from the target 200 in that the periodic structure of each cell may include fewer gratings. The first section 201 and the second section 202 of each cell may each have fewer gratings at the edge of the target 500 and/or at the center of the target 500 than the target 200. The presence of fewer gratings in the target 500 may reduce production cost and wafer space used by the target 500. The size of the target 500 and its structures may be similar in size to those of target 200 described above.

According to an embodiment of the present disclosure, the first cell width may be equal to the second cell height. The second cell width may be equal to the third cell height. The third cell width may be equal to the fourth cell height. The fourth cell width may be equal to the first cell height. For example, as shown in FIG. 5, each cell in the array of the target 500 may be square. In this arrangement, measurement performance may be improved without sacrificing real estate on the wafer.

Figure 6:
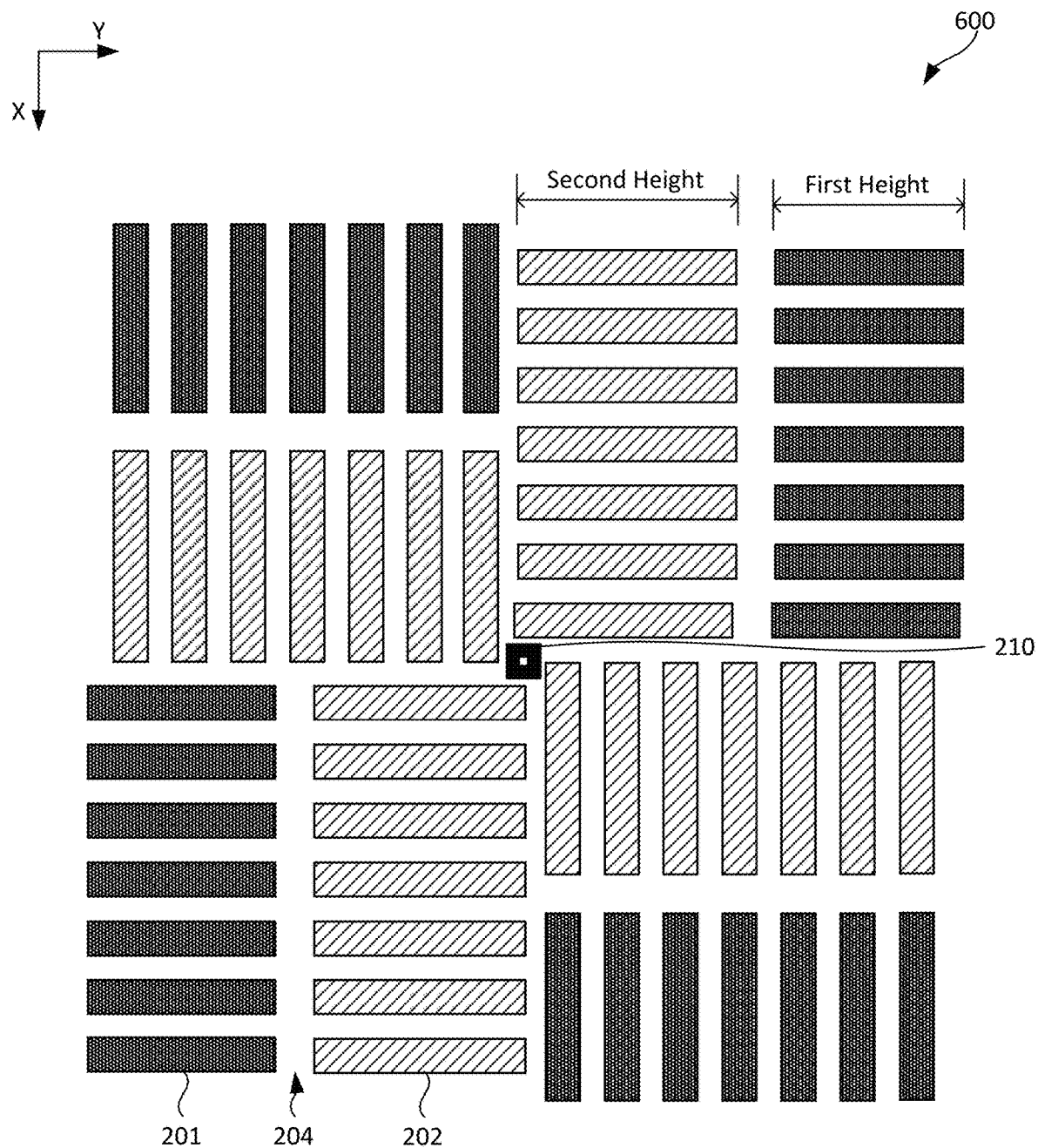
FIG. 6 is an AIM target with combined placement on eOVL target with prolongation of segments in center and edge according to an embodiment of the present disclosure.

FIG. 6 is an AIM target with combined placement on eOVL target with prolongation of segments in center and edge. The target 600 differs from the target 200 in that the periodic structure of each cell may include prolonged gratings. For example, the first periodic structure 201 may have a first height and the second periodic structure 202 may have a second height. The second height may be greater than the first height. In this way, the second periodic structure 202 of each cell may extend along each side of the centrally-located eOVL target 210. The ratio of the first height and the second height may depend on the design rules of the particular application. The size of the target 600 and its structures may be similar in size to those of target 200 described above.

Figure 7:
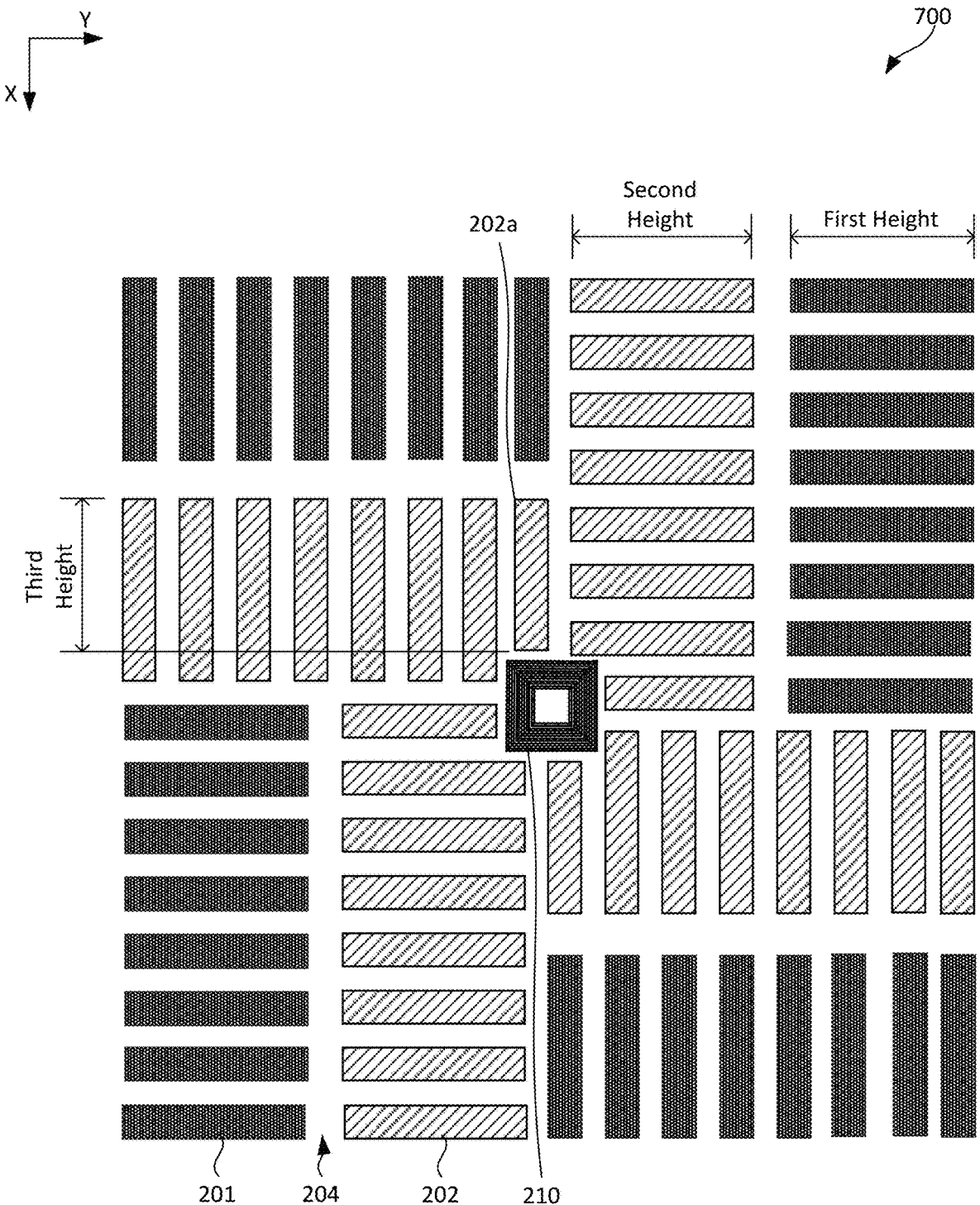
FIG. 7 is an AIM target with AIM polygon reduction according to an embodiment of the present disclosure.

FIG. 7 is an AIM target with AIM polygon reduction for optimization of real estate, process robustness, and dummification. As shown in the target 700, the eOVL target 210 may be a plurality of nested polygonal shapes disposed inside each other that define a center hollow area. The interconnected polygonal shapes may be squares, but other shapes may be possible. Dummification structures may be used to fill empty areas (e.g., white areas in FIG. 7) of the target 700 (or of other targets of the present disclosure) or to gradually change between large and small structures without interfering with target design.

The target 700 may also differ from the target 200 in that the periodic structure of each cell may include shorter gratings 202*a*. For example, the second periodic structure 202 may include gratings with a second height and a third height. The third height may be less than the second height. The ratio of the second height and the third height may depend on the design rules of the particular application. The shorter gratings 202a having the third height may be disposed adjacent to the eOVL target 210. In this way, the size of the eOVL target 210 may be increased, fitting within the space of the vacated by the shorter gratings 202a, which optimizes the real estate of the target 700. The size of the target 700 and its structures may be similar in size to those of target 200 described above.

Figure 8:
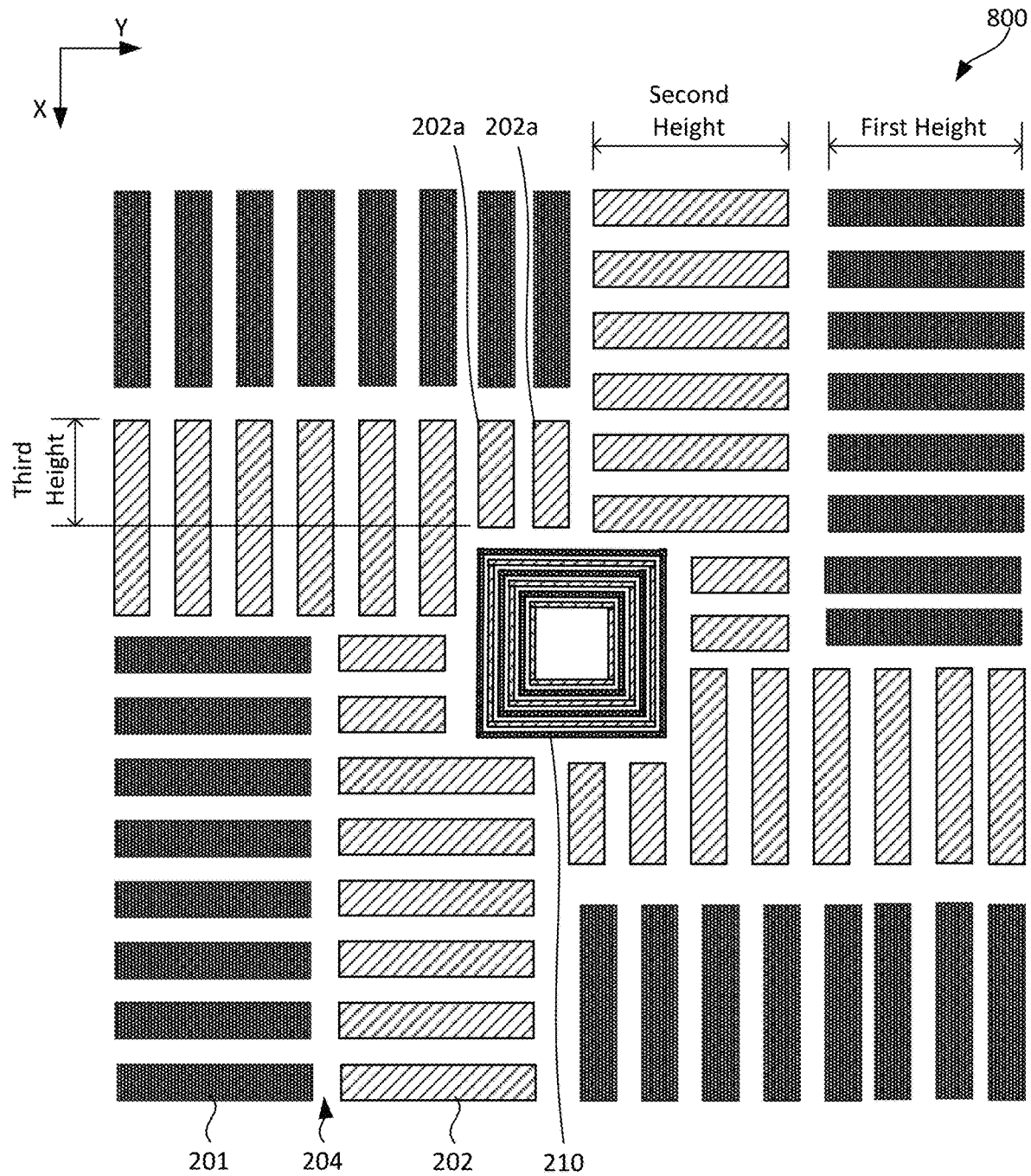
FIG. 8 is another AIM target with AIM polygon reduction according to an embodiment of the present disclosure.

FIG. 8 is another AIM target with AIM polygon reduction for optimization of real estate, process robustness, and dummification. The target 800 differs from the target 700 in that the second periodic structure of each cell may include multiple shorter gratings 202a having the third height. In this way, the size of the eOVL target 210 may be further increased, fitting within the increased space vacated by the shorter gratings 202a, which further optimizes the real estate of the target 800. The size of the target 800 and its structures may be similar in size to those of target 200 described above.

Figure 9A:
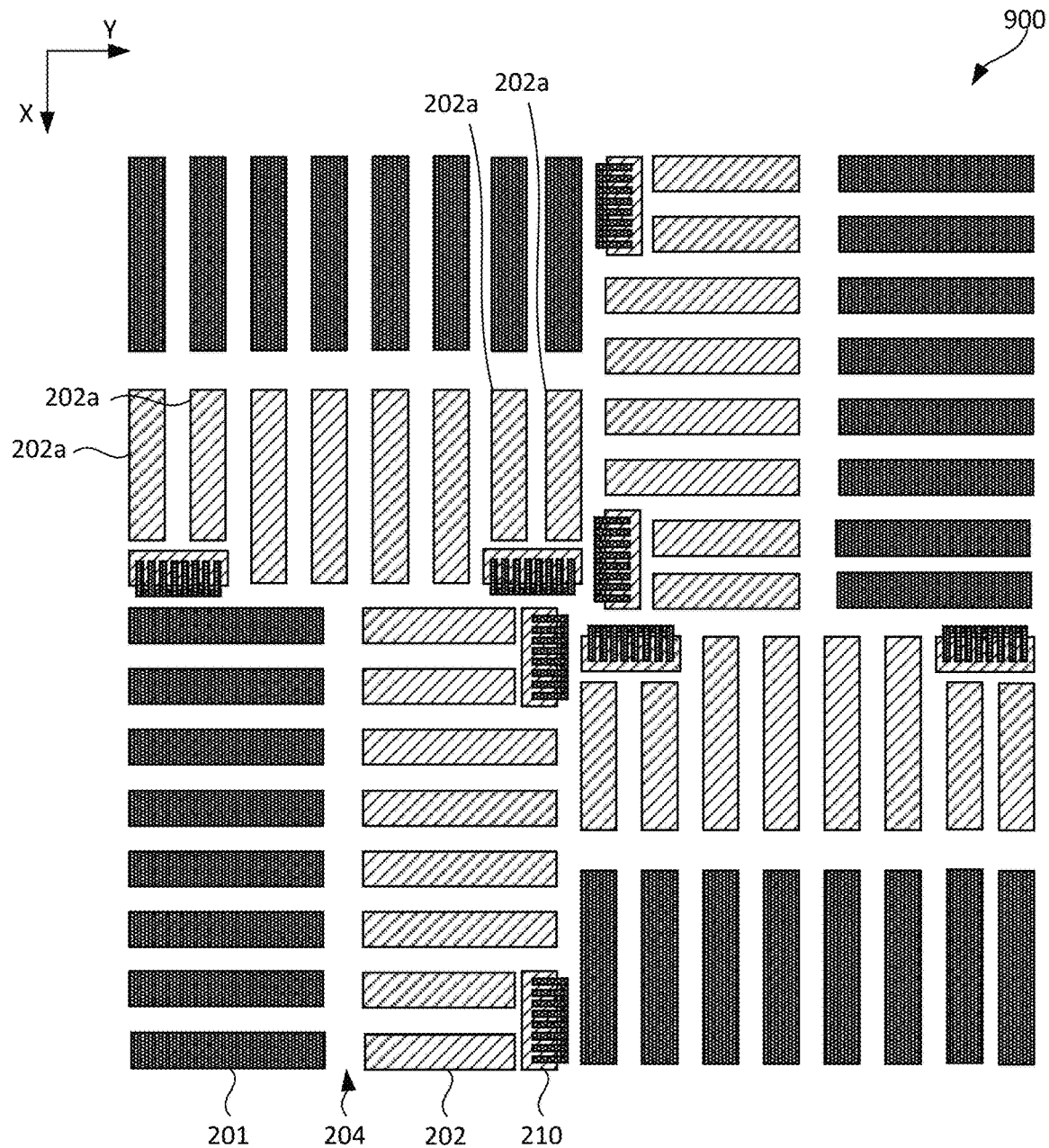
FIG. 9A is a combined AIM and eOVL target design according to an embodiment of the present disclosure.
Figure 9B:
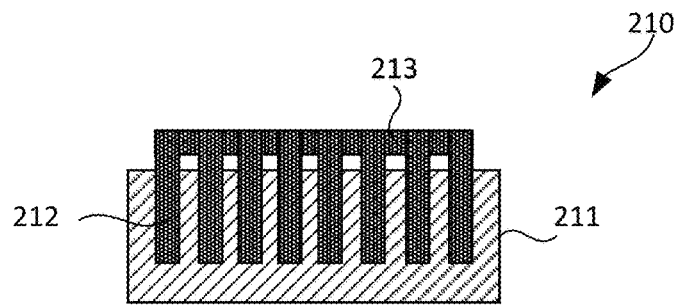
FIG. 9B shows the eOVL target of the embodiment of FIG. 9A.

FIG. 9A is a combined AIM and eOVL target design. As shown in FIG. 9B, the eOVL target 210 of the target 900 may include a body 211 and a plurality of segments 212 extending from the body 211. The plurality of segments 212 may be connected to each other by a connecting segment 213 at the ends extended away from the body 211. In this arrangement, the eOVL target 210 may define a comb-like structure. Similar structures may be used for electrical tests on a wafer. Combining existing designs of other types of metrology with optical overlay targets can be beneficial, as it can reduce the total number required for a particular design.

The target 900 may include a plurality of eOVL targets 210. For example, each cell may include two eOVL targets 210 arranged adjacent to the second periodic structure 202 at opposite ends of each cell. Each eOVL target 210 may be arranged adjacent to the shorter gratings 202a of the second periodic structure 202. For example, each eOVL target 210 may be arranged perpendicular to the shorter gratings 202a of each cell. Each eOVL target 210 may be arranged on the same side of the second periodic structure 202 of each cell. For example, each eOVL target 210 may be arranged opposite to the first gap 204 of each cell. The shorter gratings 202a may be located in the second periodic structure 202 toward the center of the target 900 and toward the edges of the target 900. In this arrangement, the target 900 may have rotational symmetry based on the placement of the eOVL targets 210 among the first periodic structures 201 and the second periodic structures 202.

According to an embodiment of the present disclosure, the periodic structures of each cell may include a first pitch and a second pitch. For example, individual gratings within the first periodic structures 201 and the second periodic structures 202 may be separated by a first pitch, and groups of periodic structures may be separated by the second pitch. The second pitch may be larger than the first pitch. The ratio of the first pitch and the second pitch may depend on the design rules of the particular application. The second periodic structure 202 of each cell may include a group of the shorter gratings 202a. The group of shorter gratings 202a may be separated from the other gratings in the second periodic structure 202 by the second pitch. The size of the target 900 and its structures may be similar in size to those of target 200 described above.

Figure 10:
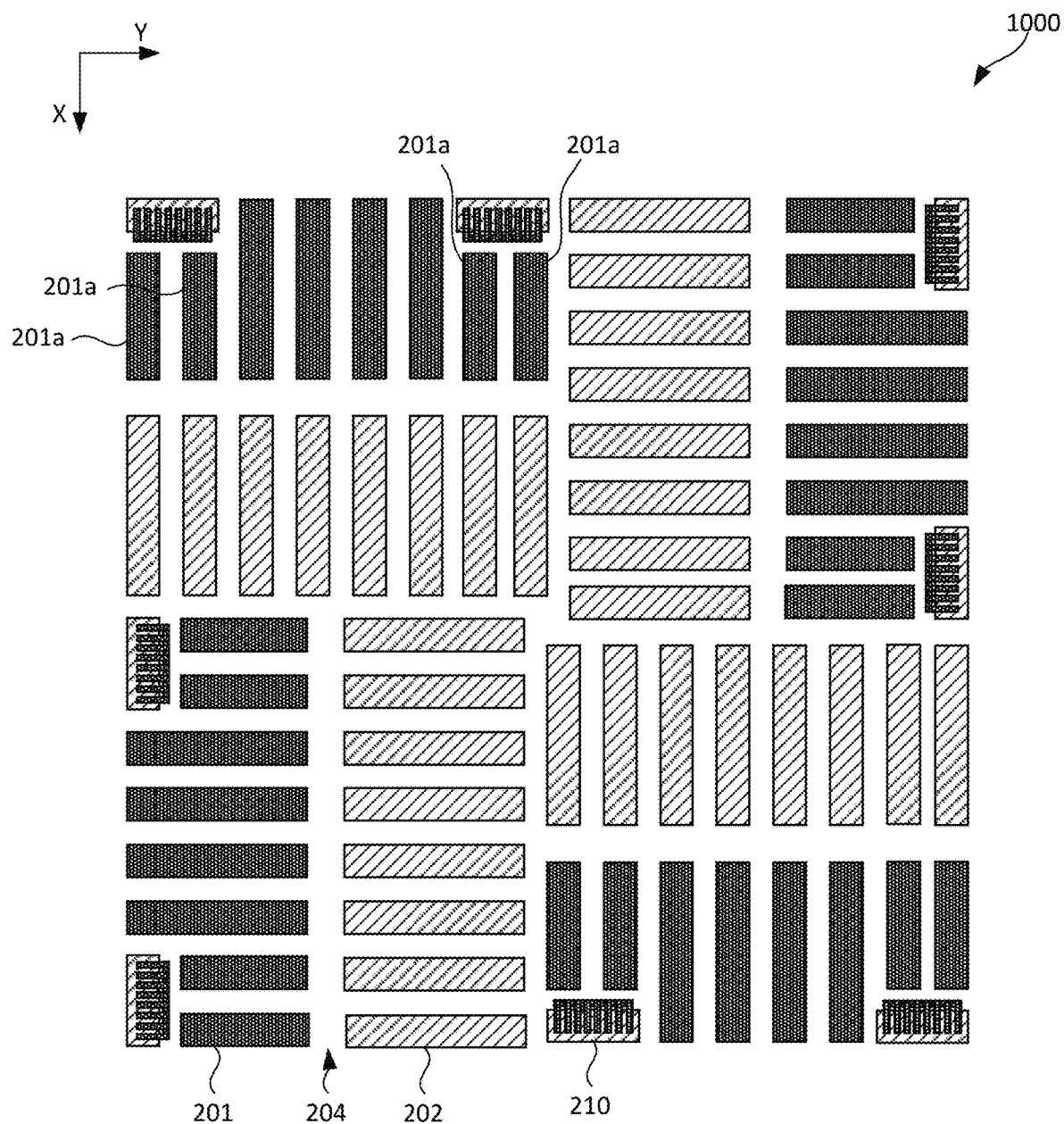
FIG. 10 is another combined AIM and eOVL target design according to an embodiment of the present disclosure.

FIG. 10 is another combined AIM and eOVL target design. The target 1000 differs from the target 900 in that each cell may include two eOVL targets 210 arranged adjacent to the first periodic structure 201 at opposite ends of each cell. The first periodic structure 201 may include shorter gratings 201a having the third height, shorter than the first height. Each eOVL target 210 may be arranged perpendicular to the shorter gratings 201a of each cell. Each eOVL target 210 may be arranged on the same side of the first periodic structure 201 of each cell. For example, each eOVL target 201 may be arranged opposite to the first gap 204 of each cell. The shorter gratings 201a may be located in the first periodic structure 201 at opposite ends of each cell, on the outer edges of the target 1000. In this arrangement, the target 1000 may have rotational symmetry based on the placement of the eOVL targets 210 among the first periodic structures 201 and the second periodic structures 202. The size of the target 1000 and its structures may be similar in size to those of target 200 described above.

Figure 11:
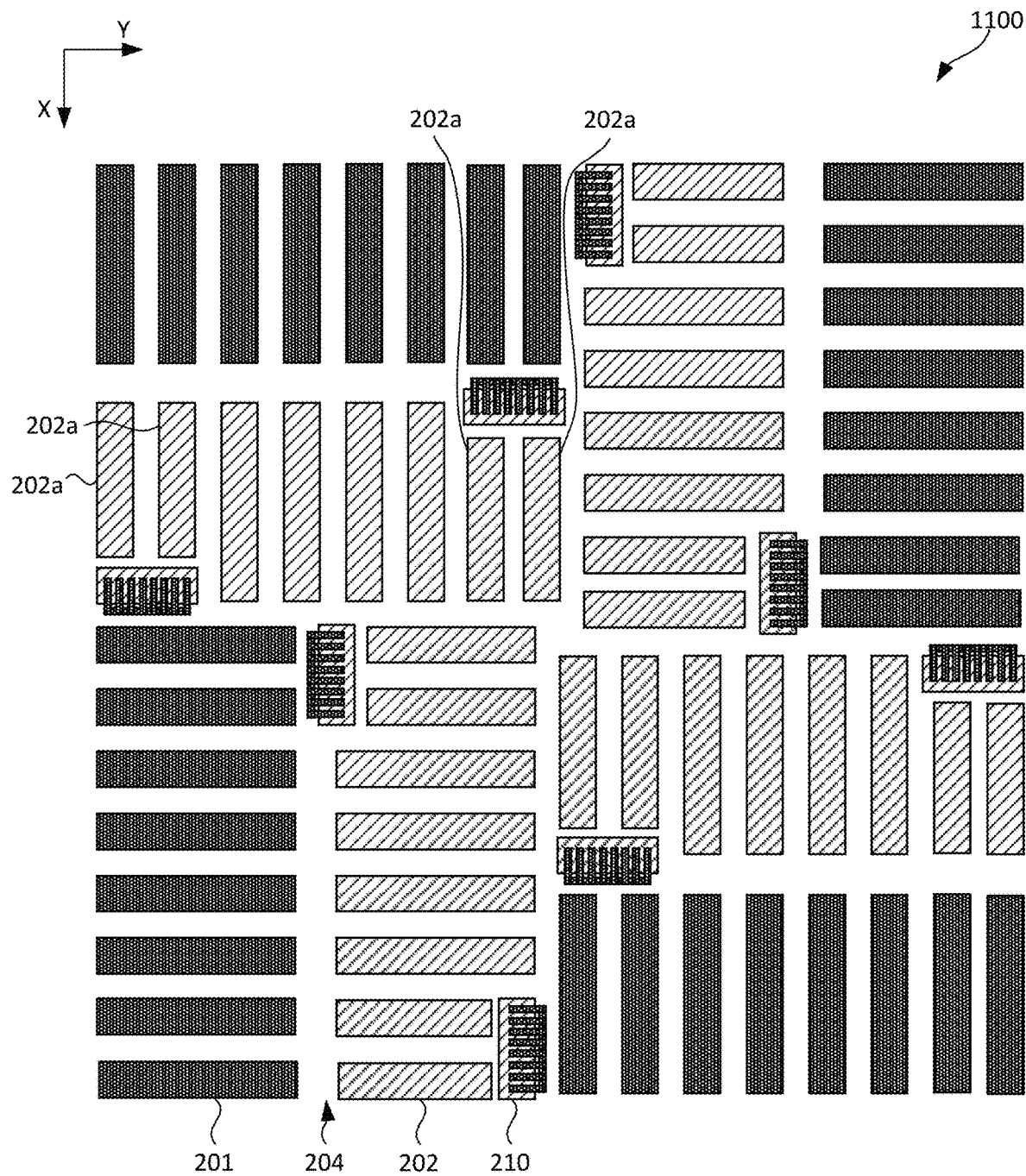
FIG. 11 is another combined AIM and eOVL target design according to an embodiment of the present disclosure.

FIG. 11 is another combined AIM and eOVL target design. The target 1100 differs from the target 900 in that the eOVL targets 210 may be arranged on opposite sides of the second periodic structure 202 of each cell. For example, one of the eOVL targets 210 may be arranged adjacent to the first gap 204, and the other of the eOVL targets 210 may be arranged opposite to the first gap 204 of each cell. In this arrangement, the target 1100 may have rotational symmetry based on the placement of the eOVL targets 210 among the first periodic structures 201 and the second periodic structures 202. The size of the target 1100 and its structures may be similar in size to those of target 200 described above.

FIG. 12A is another combined AIM and eOVL target design. As shown in FIG. 12B and FIG. 12C, the eOVL target 1210 of the target 1200 may include a body 1211 and a plurality of segments 1212 extending from both sides the body 1211. The body 1211 may be disposed between two gratings of the first section 1201 (FIG. 12B) and the second section 1202 (FIG. 12C) of the periodic structure of each cell, and the plurality of segments may be disposed on the first section 1201 and the second section 1202 respectively. The body 1211 may be comparable to existing AIM targets, which may be beneficial in certain cases. The two gratings of the first section 1201 and the second section 1202 disposed on either side of the body 1211 may have a width and a pitch that is less than that of other gratings in the first section 1201 and the second section 1202. The first section 1201 and the second section 1202 of the periodic structure of each cell may be separated by a first gap 1204. In this arrangement, the eOVL target 210 may be mixed optical target while keeping the overall symmetry. This may be beneficial where having different pitches close by is problematic for manufacturing, where dummification structures may be otherwise placed.

The target 1200 may include a plurality of eOVL targets 1210. For example, each cell may include a plurality of eOVL targets 1210 disposed alternately between the first section 1201 and the second section 1202 of the periodic structure. As shown in FIG. 12A, the target 1200 may include two eOVL targets 1210 arranged between the gratings of the first section 1201 and three eOVL targets 1210 arranged on either side of each of the gratings of the second section 1202. The inversion of the layer combinations between FIG. 12B and FIG. 12C may be beneficial as it may ensure that the signal content between the layers is as similar as possible, such that no layer signal will dominate the overlay result. The size of the target 1200 and its structures may be similar in size to those of the target 200 described above.

Figure 13:
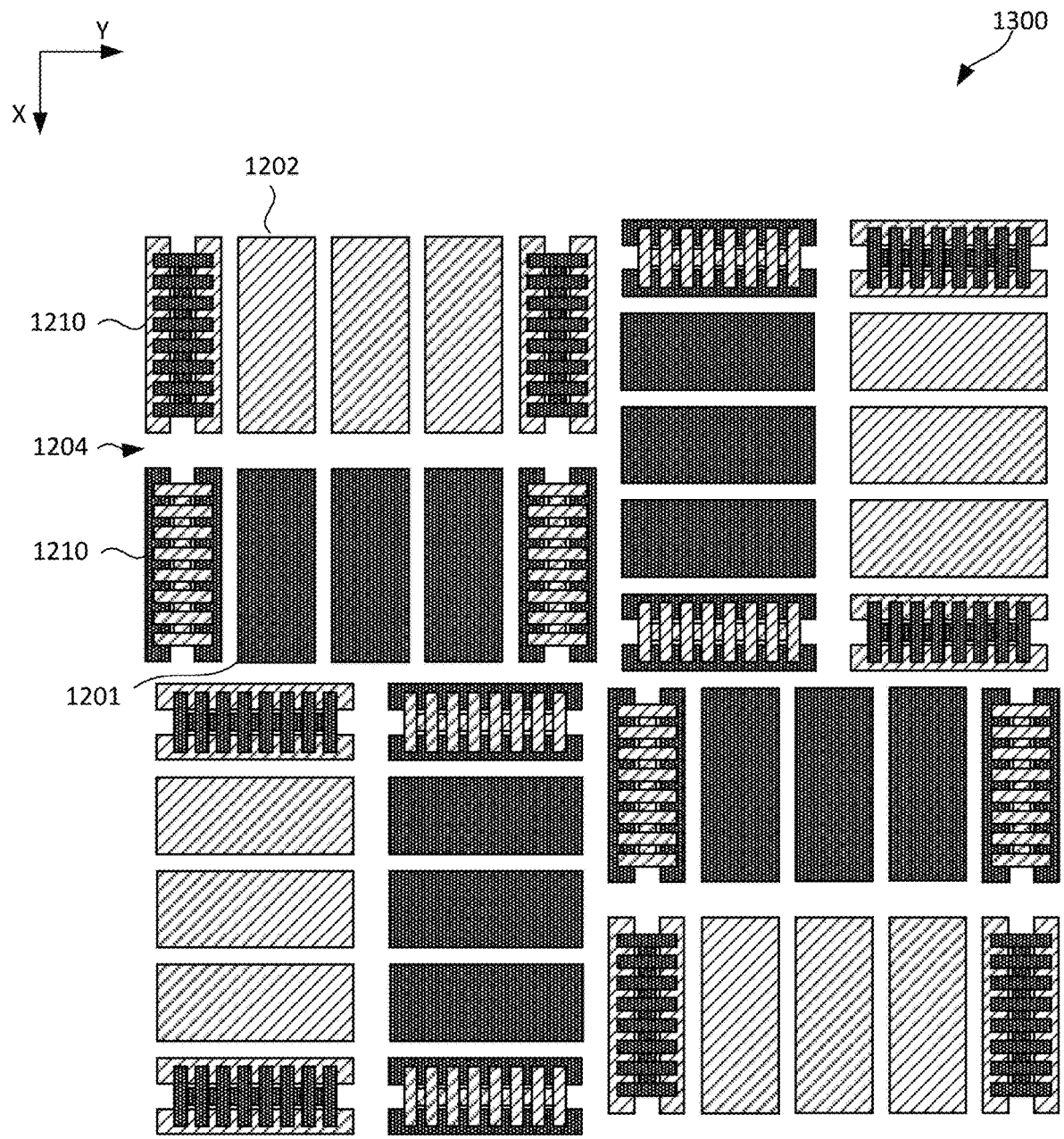
FIG. 13 is another combined AIM and eOVL target design according to an embodiment of the present disclosure.

FIG. 13 is another combined AIM and eOVL target design. The target 1300 differs from the target 1200 in that the plurality of eOVL targets 1210 disposed in each cell are disposed at the ends of the first section 1201 and the second section 1202 of the periodic structure. In this way, the plurality of eOVL targets 1210 may be disposed adjacent to the center of the target 1300 and/or adjacent to the outer edges of the target 1300. This symmetry of the placement of the eOVL targets 1210 in the first section 1201 and the second section 1202 may be beneficial under certain design rules. The size of the target 1300 and its structures may be similar in size to those of the target 200 described above.

Figure 14:
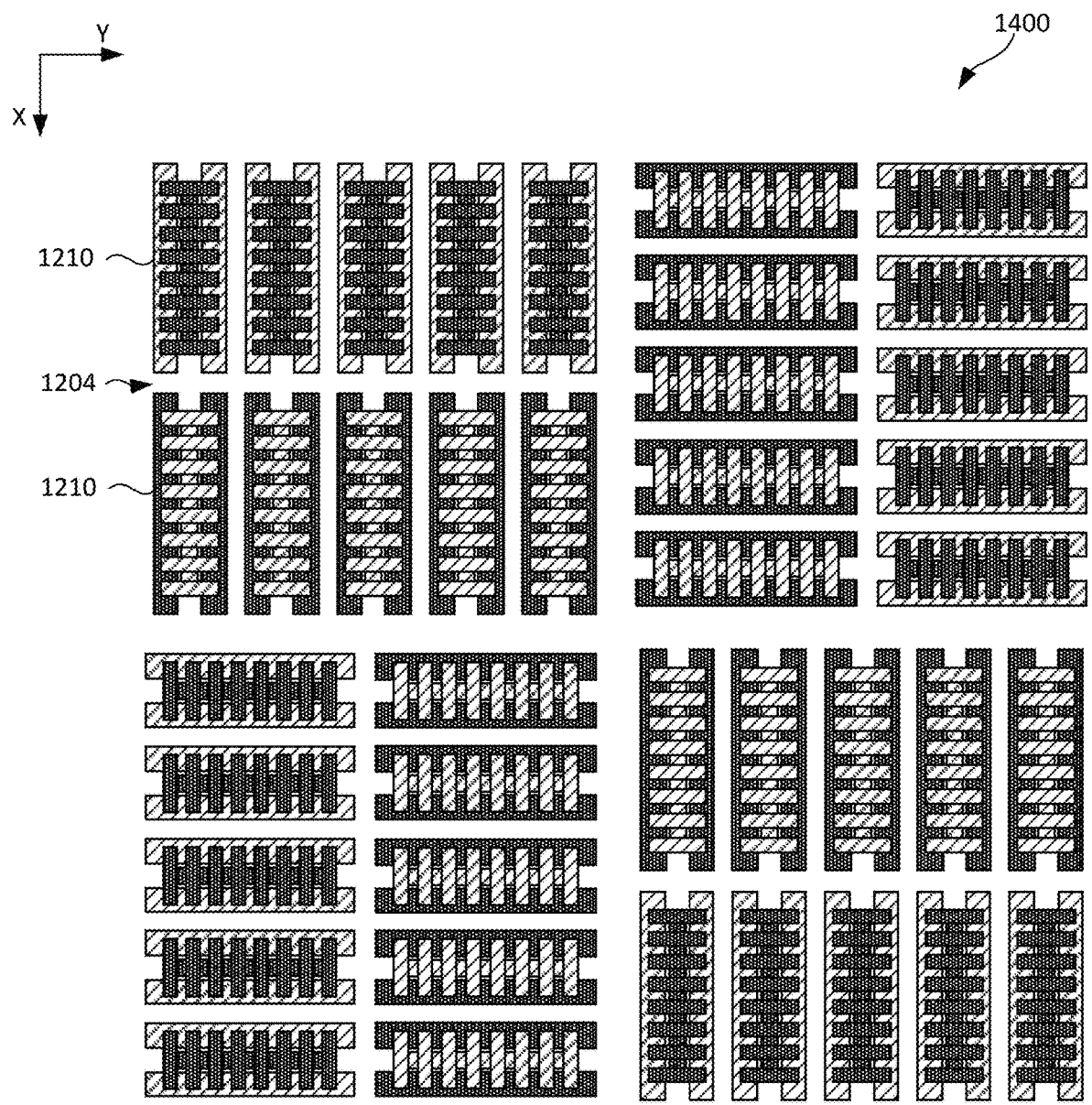
FIG. 14 is another combined AIM and eOVL target design according to an embodiment of the present disclosure.

FIG. 14 is another combined AIM and eOVL target design. The target 1400 differs from the target 1200 in that the plurality of eOVL targets 1210 are disposed between each pair of gratings of the first section 1201 and the second section 1202 of the periodic structure of each cell. In this way, each cell of the target 1400 may comprise the plurality of eOVL targets 1210 arranged consecutively within the first section 1201 and the second section 1202 of the periodic structure. The size of the target 1400 and its structures may be similar in size to those of the target 200 described above. In this arrangement, the target 1400 may be fully regular and symmetric, which may be beneficial under some design rules.

Figure 15:
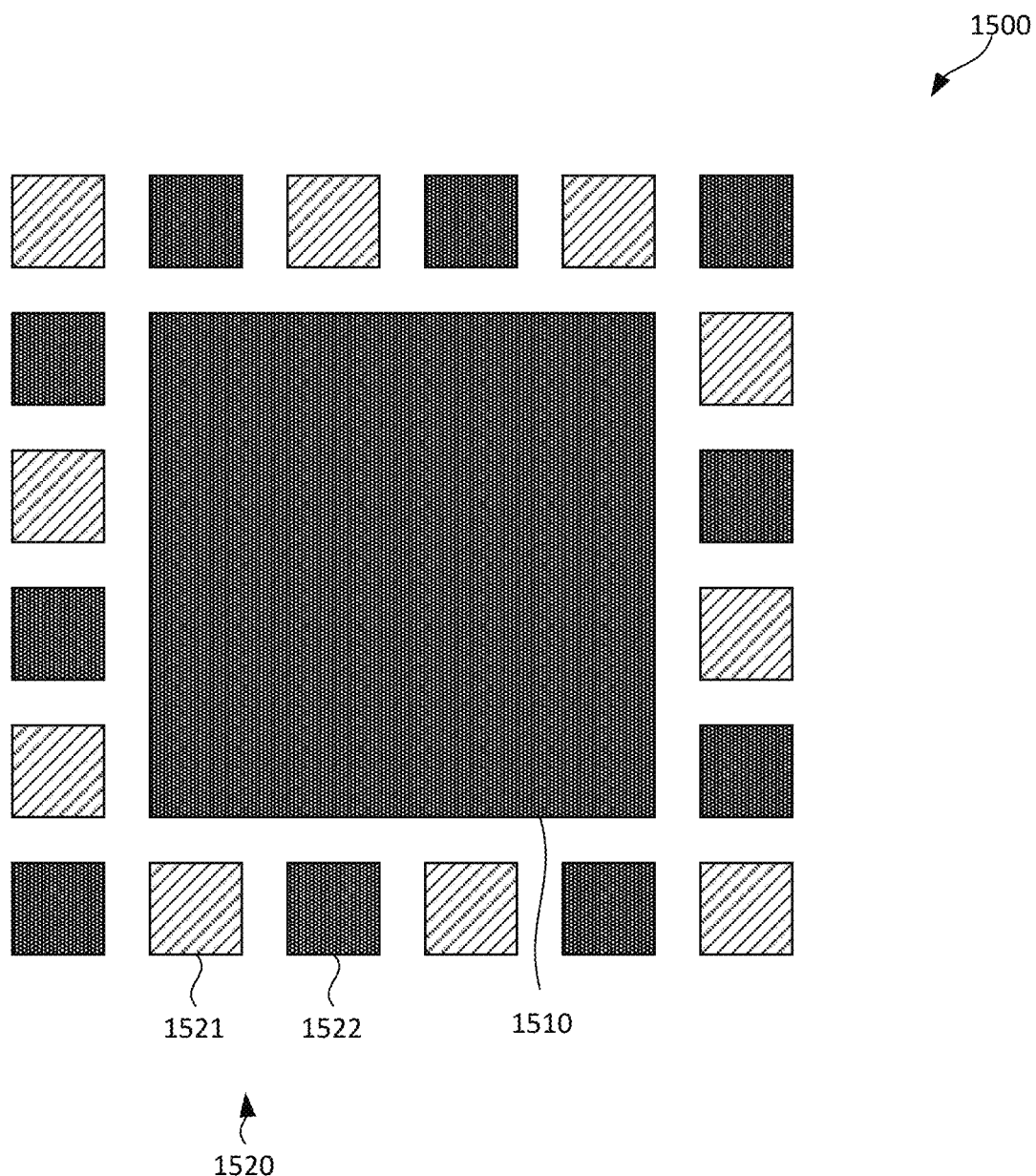
FIG. 15 is a field layout with two types of combined AIM and eOVL targets according to an embodiment of the present disclosure.

FIG. 15 is a field layout with two types of combined AIM and eOVL targets. The layout 1500 may comprise a central target 1510 and a plurality of outer targets 1520 arranged around the periphery of the central target 1510. The size of the layout 1500 and the spacing between the targets may depend on the design rules of the particular application. The central target 1510 may be larger than the plurality of outer targets 1520. The ratio of the size of the central target 1510 to the outer targets 1520 may be defined by balancing the relative signal strengths and the available area on the wafer. The central target 1510 and the plurality of outer targets 1520 may be any of the target designs described herein. The plurality of outer targets 1520 may include a first target type 1521 and a second target type 1522. The first target type 1521 and the second target type 1522 may be any two different target designs described herein or combination thereof. One of the first target type 1521 and the second target type 1522 may be of the same target design as the central target 1510. Alternatively, the first target type 1521 and the second target type 1522 may be different target designs from the central target 1510. The plurality of outer targets 1520 may be arranged around the periphery of the central target 1510 in an alternating manner. For example, as shown in FIG. 15, the plurality of outer targets 1520 may alternate between the first target type 1521 and the second target type 1522. By alternating target types, accuracy per target may be improved, and target noise may be reduced. As each target design can have its own accuracy errors and offsets, it may be possible to choose targets for the layout 1500 in such a way that the accuracy errors and offsets may at least partially cancel out, and may thereby improve accuracy.

Figure 16:
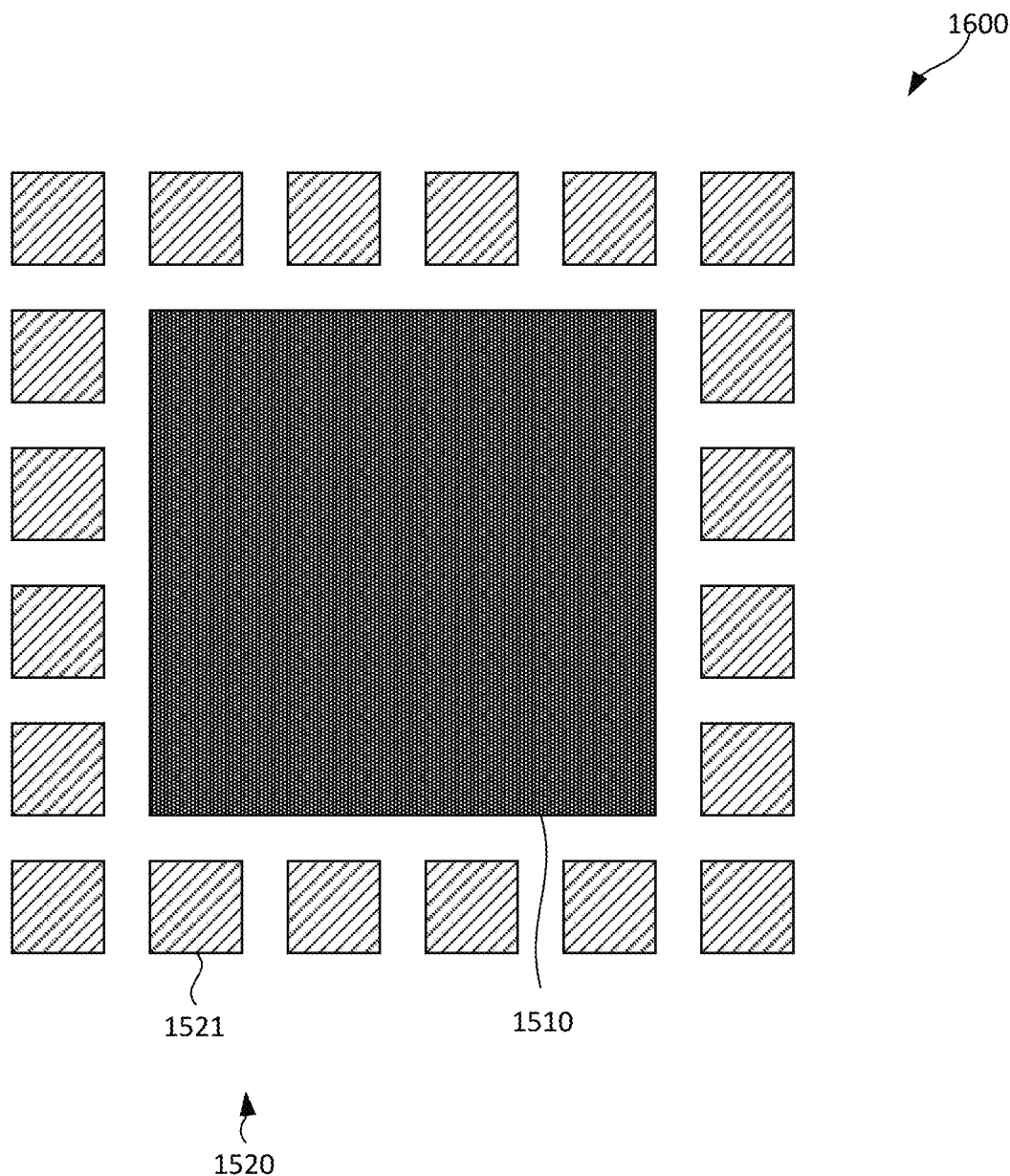
FIG. 16 is a field layout with single types of combined AIM and eOVL targets according to an embodiment of the present disclosure.

FIG. 16 is a field layout with single types of combined AIM and eOVL targets. The layout 1600 differs from the layout 1500 in that the plurality of outer targets 1520 includes only the first target type 1521. The first target type 1521 may be different from the target design of the central target 1510. The size of the layout 1600 and the spacing between the targets may depend on the design rules of the particular application.

Figure 17:
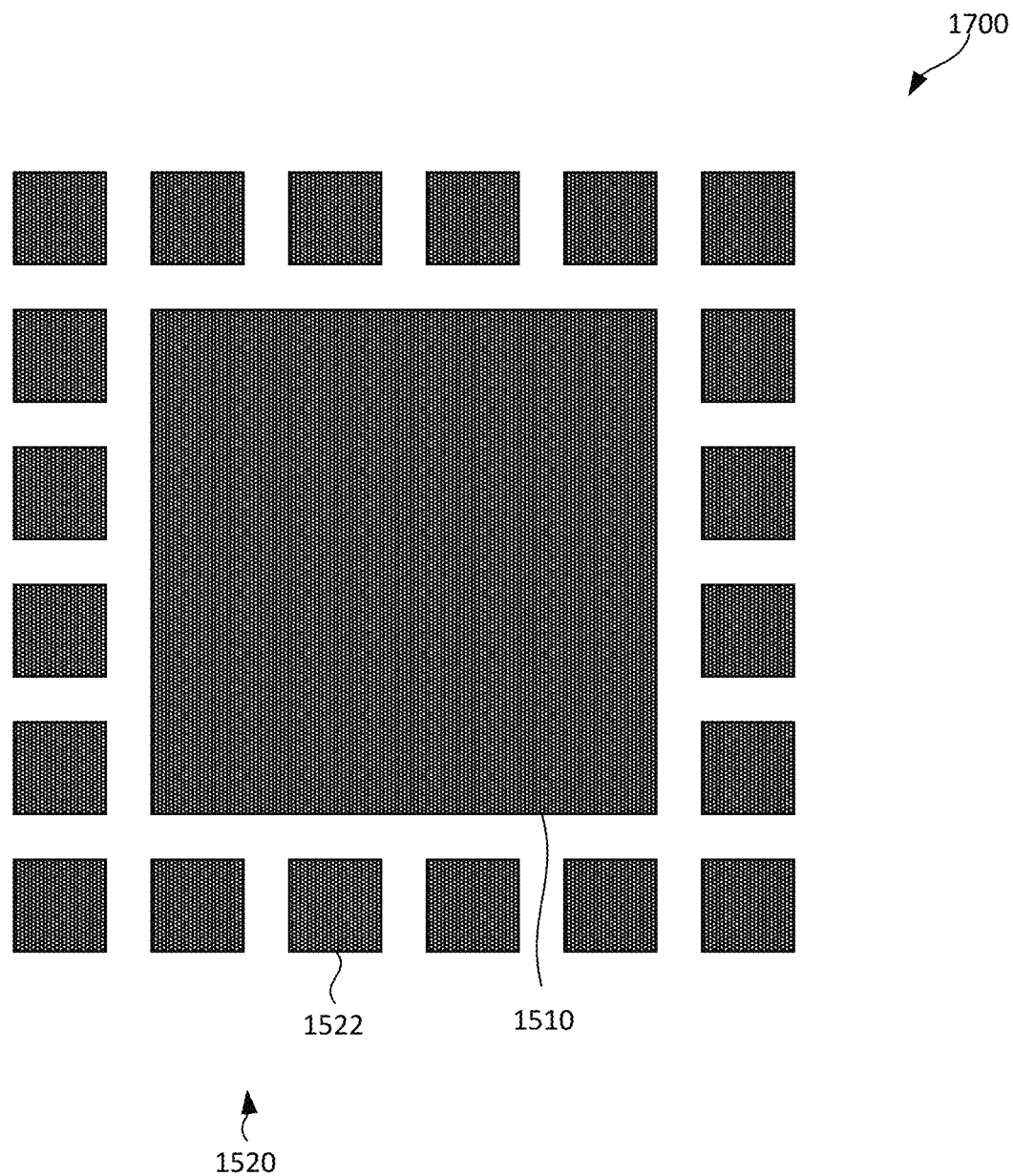
FIG. 17 is another field layout with single types of combined AIM and eOVL targets according to an embodiment of the present disclosure.

FIG. 17 is another field layout with single types of combined AIM and eOVL targets. The layout 1700 differs from the layout 1500 in that the plurality of outer targets 1520 includes only the second target type 1522. The second target type 1522 may be the same as the target design of the central target 1510. The size of the layout 1700 and the spacing between the targets may depend on the design rules of the particular application.

Figure 18:
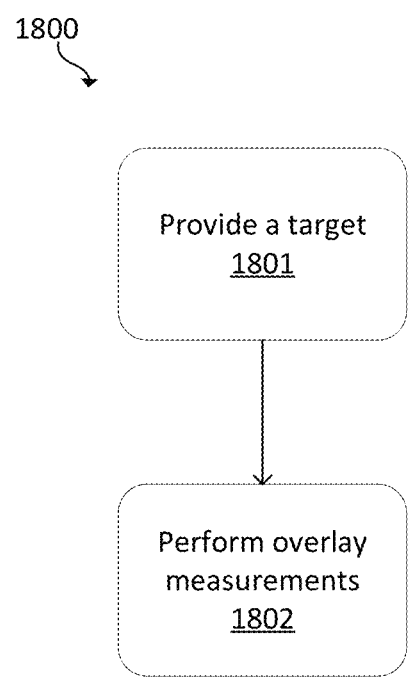
FIG. 18 is a method of performing overlay measurements using a semiconductor tool according to an embodiment of the present disclosure.

FIG. 18 is a flowchart of a method 1800. In the method, a target is provided at 1801. The target can be one of the targets disclosed herein. Overlay measurements are performed at 1802 using a semiconductor metrology tool. The semiconductor metrology tool may be a conventional tool, which utilizes conventional processing algorithms, or may be an electron beam tool, which uses different measurement techniques. For example, one beam spot can be applied to a grating. A single reflectivity value is collected per grating. Each cell will contain an induced offset to calculate overlay. At least four cells with different induced offsets may be used. This method can be propagated until "n" cells occur. A beam spot can be scanned to average spot position accuracy.

Figure 19:
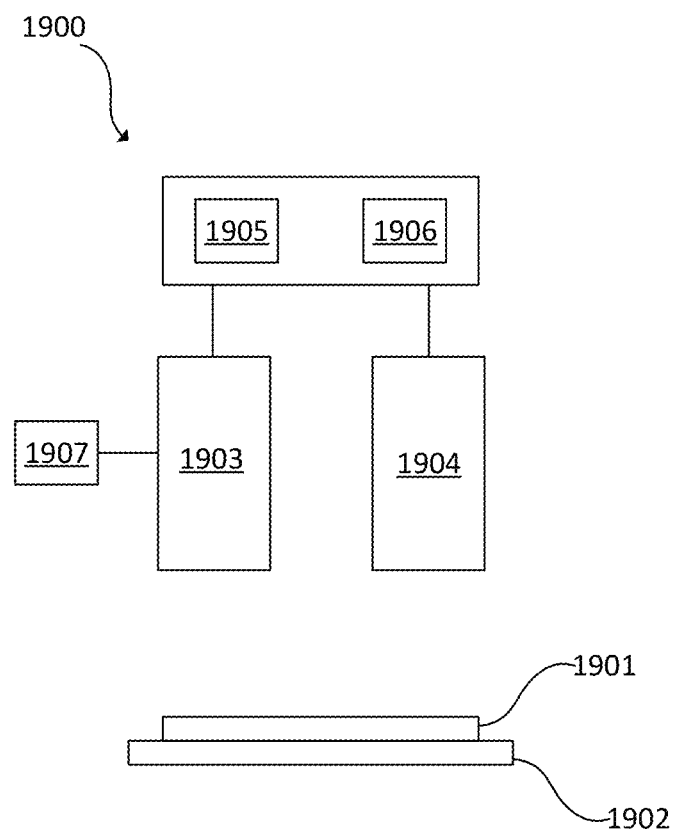
FIG. 19 is a diagram of a system according to an embodiment of the present disclosure.

FIG. 19 is a diagram of a system 1900. The system 1900 includes a chuck 1902 configured to hold a wafer 1901. The wafer 1901 includes one or more overlay targets, such as those described in the embodiments herein.

The system 1900 includes an imaging optical system 1903 configured to measure the overlay target on the chuck 1902. The imaging optical system 1903 can include an illumination source oriented to direct radiation onto a specific location of the wafer 1901 and one or more detectors oriented to detect an optical signal which from the wafer 1901. The illumination source in the optical system 1903 can generate an illumination beam directed at the wafer 1901. The imaging optical system 1903 also can include various lenses, optical components, other steering devices, or other beam transport devices. The illumination beam can be an optical beam or an electron beam.

The imaging optical system 1903 can be used for acquisition such that the imaging optical system 1903 is part of the acquisition sequence of the scatterometry measurement.

The system 1900 includes a scatterometry system 1904 configured to measure the overlay target on the chuck 1902. The scatterometry system 1904 can be configured to measure the same overlay target as the imaging optical system 1903.

The scatterometry system 1904 can include an illumination source oriented to direct radiation onto a specified location of the wafer 1901 and one or more detectors oriented to detect a scatterometry signal which has been scattered by the wafer 1901. The illumination source in the scatterometry system 1904 can generate an illumination beam directed at the wafer 1901. The scatterometry system 1904 also can include various lenses or optical components. The scatterometry system 1904 can use the imaging optical system 1903 or information from the imaging optical system 1903 during the scatterometry sequence.

Measurements of the wafer 1901 by the imaging optical system 1903 and the scatterometry system 1904 can be performed while the wafer 1901 remains on the chuck 1902. Thus, the wafer 1901 may not move between measurement by the imaging optical system 1903 and the scatterometry system 1904. In an instance, a vacuum around the wafer 1901 is not broken between measurements by the imaging optical system 1903 and the scatterometry system 1904. In an instance, one of the measurements by the imaging optical system 1903 and the scatterometry system 1904 occurs after the other. In another instance, the measurements by the imaging optical system 1903 and the scatterometry system 1904 occur at least partially simultaneously or at the same time.

While disclosed as one system 1900, the imaging optical system 1903 and the scatterometry system 1904 can be in two separate systems. Each of the systems may have a separate chuck.

A processor 1905 is in electronic communication with an electronic data storage unit 1906, the imaging optical system 1903, and the scatterometry system 1904. The processor 1905 may include a microprocessor, a microcontroller, or other devices. The processor 1905 can receive output from the imaging optical system 1903 and the scatterometry system 1904.

The system 1900 can include an imaging optical system acquisition module 1907 configured to acquire the overlay target on the chuck 1902 with the imaging optical system 1903. The optical system acquisition module 1907 forms an acquisition image that can be used by the imaging optical system 1903 or the scatterometry system 1904. While illustrated as separate units, the imaging optical system acquisition module 1907 may be part of the imaging optical system 1903. The imaging optical system acquisition module 1907 also may be part of the processor 1905.

The processor 1905 and electronic data storage unit 1906 may be part of the system 1900 or another device. In an example, the processor 1905 and electronic data storage unit 1906 may be part of a standalone control unit or in a centralized quality control unit. Multiple processors 1905 or electronic data storage unit 1906 may be used. In an embodiment, the processor 1905 may be disposed in the system 1900.

The processor 1905 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 1905 to implement various methods and functions may be stored in readable storage media, such as a memory in the electronic data storage unit 1906 or other memory.

The processor 1905 may be coupled to the components of the system 1900 in any suitable manner (e.g., via one or more transmission media, which may include wired and/or wireless transmission media) such that the processor 1905 can receive output. The processor 1905 may be configured to perform a number of functions using the output.

The processor 1905, other system(s), or other subsystem(s) described herein may be part of various systems, including a personal computer system, image computer, mainframe computer system, workstation, network appliance, interne appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 1905 may be configured to perform a number of functions using the output of the imaging optical system 1903, and the scatterometry system 1904, or other output. For instance, the processor 1905 may be configured to send measurement results of the wafer 1901. In another example, the processor 1905 can determine electron beam overlay and/or scatterometry overlay error within the target. In another example, the processor 1905 may be configured to send the output to an electronic data storage unit 1906 or another storage medium. The processor 1905 may be further configured as described herein.

The processor 1905 may be configured according to any of the embodiments described herein. The processor 1905 also may be configured to perform other functions or additional steps using the output of the system 1900 or using images or data from other sources.

In another embodiment, the processor 1905 may be communicatively coupled to any of the various components or sub-systems of system 1900 in any manner known in the art. Moreover, the processor 1905 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 1905 and other subsystems of the system 1900 or systems external to system 1900.

In some embodiments, various steps, functions, and/or operations of system 1900 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link.

For instance, the various steps described throughout the present disclosure may be carried out by a single processor 1905 (or computer system) or, alternatively, multiple processors 1905 (or multiple computer systems). Moreover, different sub-systems of the system 1900 may include one or more computing or logic systems. Therefore, the above description should not be interpreted as a limitation on the present disclosure but merely an illustration.

An additional embodiment relates to a non-transitory computer-readable medium storing program instructions executable on a processor for inspecting a wafer, as disclosed herein. In particular, a processor, such as the processor 1905, can be coupled to a memory in an electronic data storage medium, such as the electronic data storage unit 1906, with non-transitory computer-readable medium that includes executable program instructions. The computer-implemented method may include any step(s) of any method(s) described herein. For example, processor 1905 may be programmed to perform some or all of the steps of FIG. 18. The memory in the electronic data storage unit 1906 may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

In another embodiment, a method of designing of the targets disclosed herein can be used. The method may be performed with a processor, such as those described therein. The gratings of the first and second periodic structures of the targets disclosed herein can be optimized.

While specific configurations are shown in the embodiments illustrated herein, variations that include all or some of the features of these embodiments are possible.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A target comprising:
an array of cells comprising a first cell, a second cell, a third cell, and a fourth cell, each comprising a periodic structure with a pitch, wherein the periodic structure includes a first section and a second section, separated by a first gap; and
an electron beam overlay target disposed in a center of the array of cells comprising the first cell, the second cell, the third cell, and the fourth cell.

2. The target of claim 1, wherein the first cell, the second cell, the third cell, and the fourth cell are arranged having rotational symmetry.

3. The target of claim 1, wherein the periodic structure of each cell further includes a third section separated by a second gap.

4. The target of claim 1, wherein the periodic structure of the first cell has a first cell height along the first axis and a first cell width along the second axis, the periodic structure of the second cell has a second cell height along the second axis and a second cell width along the first axis, the periodic structure of the third cell has a third cell height along the second axis and a third cell width along the first axis, and the periodic structure of the fourth cell has a fourth cell height along the first axis and a fourth cell width along the second axis, and wherein the first cell width is greater than the second cell height, the second cell width is greater than the third cell height, the third cell width is greater than the fourth cell height, and the fourth cell width is greater than the first cell height.

5. The target of claim 1, wherein the periodic structure of the first cell has a first cell height along the first axis and a first cell width along the second axis, the periodic structure of the second cell has a second cell height along the second axis and a second cell width along the first axis, the periodic structure of the third cell has a third cell height along the second axis and a third cell width along the first axis, and the periodic structure of the fourth cell has a fourth cell height along the first axis and a fourth cell width along the second axis, and wherein the first cell width is equal to the second cell height, the second cell width is equal to the third cell height, the third cell width is equal to the fourth cell height, and the fourth cell width is equal to the first cell height.

6. The target of claim 1, wherein part of the electron beam overlay target is a plurality of nested polygonal shapes disposed inside each other that define a center hollow area.

7. The target of claim 6, wherein the interconnected polygonal shapes are squares.

8. The target of claim 6, wherein the periodic structure of each cell have a first height and a second height larger than the first height, and wherein the periodic structure with the second height is disposed adjacent the electron overlay target.

9. The target of claim 6, wherein the second section of the periodic structure of each cell has a second height and a third height less than the second height, and wherein the periodic structure with the third height is disposed adjacent the electron overlay target.

10. A method of performing overlay measurements on the target of claim 1 using a semiconductor metrology tool.

11. A target comprising:
an array of cells comprising a first cell, a second cell, a third cell, and a fourth cell, each comprising a periodic structure with a pitch, wherein the periodic structure includes a first section and a second section, separated by a first gap; and
a plurality of electron beam overlay targets disposed at an edge of the first cell, the second cell, the third cell, and the fourth cell, wherein each of the electron beam overlay targets includes a body, a plurality of segments extending from the body, and a connecting segment which connects ends of the plurality of segments.

12. The target of claim 11, wherein the plurality of the electron beam overlay targets are disposed at the edge of the first cell, the second cell, the third cell, and the fourth cell adjacent to the first section of the periodic structure.

13. The target of claim 11, wherein the plurality of the electron beam overlay targets are disposed at the edge of the first cell, the second cell, the third cell, and the fourth cell adjacent to the second section of the periodic structure.

14. The target of claim 13, wherein the plurality of the electron beam overlay targets are disposed at the edge of the first cell, the second cell, the third cell, and the fourth cell adjacent to the first gap.

15. The target of claim 11, wherein the periodic structures further includes a second pitch between groups of a plurality of periodic structures at the pitch, wherein the second pitch is larger than the first pitch.

16. A method of performing overlay measurements on the target of claim 11 using a semiconductor metrology tool.

17. A target comprising:
an array of cells comprising a first cell, a second cell, a third cell, and a fourth cell, each comprising a periodic structure with a pitch, wherein the periodic structure includes a first section and a second section, separated by a first gap; and
a plurality of electron beam overlay targets, wherein each of the electron beam overlay targets includes a plurality of segments extending from two sides of a body, wherein the body is disposed between pairs gratings in the first section and the second section of the periodic structure and the plurality of segments are disposed on the pairs of gratings in the first and second section adjacent to the body.

18. The target of claim 17, wherein the plurality of electron beam overlay targets are disposed between pairs of gratings at ends of the first section and the second section of the periodic structure of each cell.

19. The target of claim 17, wherein the plurality of electron beam overlay targets are disposed between each pair of gratings of the first section and the second section of the periodic structure of each cell.

20. A method of performing overlay measurements on the target of claim 16 using a semiconductor metrology tool.

\* \* \* \* \*